United States Patent
Ryu et al.

(10) Patent No.: US 8,969,131 B2
(45) Date of Patent: Mar. 3, 2015

(54) THIN FILM TRANSISTOR PANEL AND FABRICATING METHOD THEREOF

(71) Applicant: Samsung Display Co., Ltd., Yongin (KR)

(72) Inventors: Hye-Young Ryu, Seoul (KR); Jin-Won Lee, Cheonan-si (KR); Woo-Geun Lee, Yongin-si (KR); Hee-Jun Byeon, Suwon-si (KR); Xun Zhu, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/094,001

(22) Filed: Dec. 2, 2013

(65) Prior Publication Data

US 2014/0093998 A1     Apr. 3, 2014

Related U.S. Application Data

(62) Division of application No. 13/092,882, filed on Apr. 22, 2011, now Pat. No. 8,598,583.

(30) Foreign Application Priority Data

May 7, 2010    (KR) .......................... 10-2010-0043212

(51) Int. Cl.
*G02F 1/136*  (2006.01)
*H01L 27/12*  (2006.01)
*H01L 27/32*  (2006.01)
*H01L 51/52*  (2006.01)

(52) U.S. Cl.
CPC ........ *H01L 27/1288* (2013.01); *H01L 27/1214* (2013.01); *H01L 27/1225* (2013.01); *H01L 27/3272* (2013.01); *H01L 51/5253* (2013.01); *H01L 2227/323* (2013.01)
USPC ................. 438/104; 257/E21.46; 349/44

(58) Field of Classification Search
USPC ................. 458/104; 25/E21.46; 349/44
See application file for complete search history.

(56) References Cited

U.S. PATENT DOCUMENTS

2004/0056251 A1   3/2004  Kim et al.
2005/0270434 A1*  12/2005 Jung et al. ..................... 349/43

(Continued)

FOREIGN PATENT DOCUMENTS

CN    1420554        5/2003
JP    11-326954      11/1999

(Continued)

OTHER PUBLICATIONS

Non-Final Office Action issued in U.S. Appl. No. 13/092,882, dated Feb. 13, 2013.

(Continued)

*Primary Examiner* — Thomas L Dickey
(74) *Attorney, Agent, or Firm* — H.C. Park & Associates, PLC

(57) ABSTRACT

A thin film transistor panel includes a substrate, a light blocking layer on the substrate, a first protective film on the light blocking layer, a first electrode and a second electrode on the first protective film, an oxide semiconductor layer on a portion of the first protective film exposed between the first electrode and the second electrode, an insulating layer, a third electrode overlapping with the oxide semiconductor layer and on the insulating layer, and a fourth electrode on the insulating layer. The light blocking layer includes first sidewalls, and the first protective film includes second sidewalls. The first and the second sidewalls are disposed along substantially the same line.

8 Claims, 27 Drawing Sheets

(56) References Cited

U.S. PATENT DOCUMENTS

| | | |
|---|---|---|
| 2009/0174835 A1 | 7/2009 | Lee et al. |
| 2010/0117079 A1 | 5/2010 | Miyairi et al. |
| 2010/0279474 A1 | 11/2010 | Akimoto et al. |

FOREIGN PATENT DOCUMENTS

| | | |
|---|---|---|
| KR | 10-2000-0038298 | 7/2000 |
| KR | 10-2007-0072115 | 7/2007 |
| KR | 10-2010-0132308 | 12/2010 |

OTHER PUBLICATIONS

Final Office Action issued in U.S. Appl. No. 13/092,882, dated May 23, 2013.

Notice of Allowance issued in U.S. Appl. No. 13/092,882, dated Jul. 31, 2013.

The First Office Action issued on Nov. 4, 2014, in Chinese Patent Application No. 201110125831.8.

\* cited by examiner

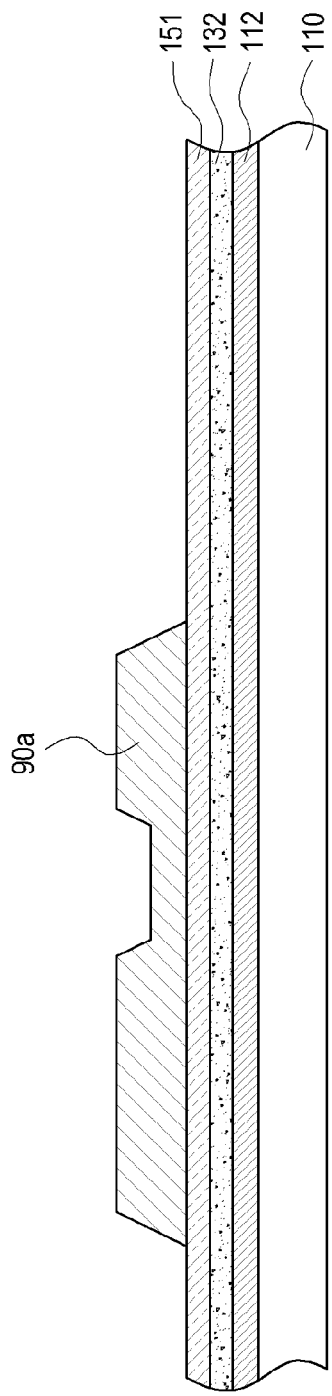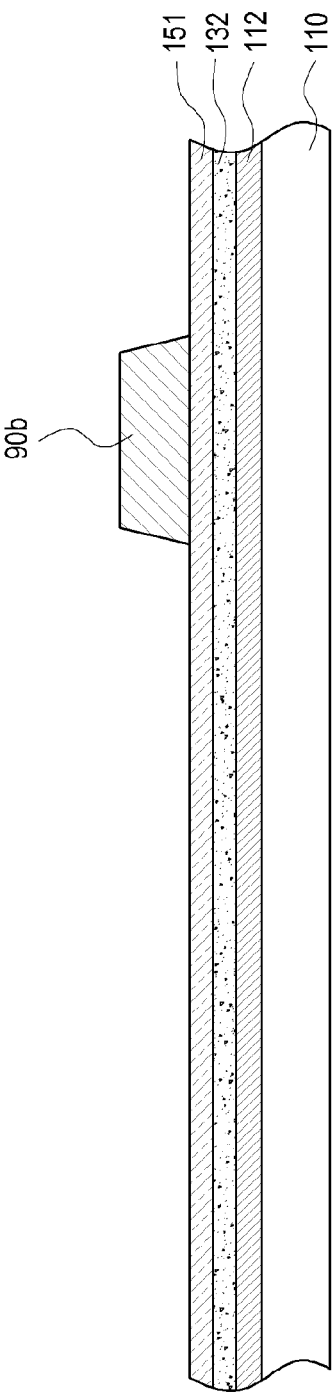

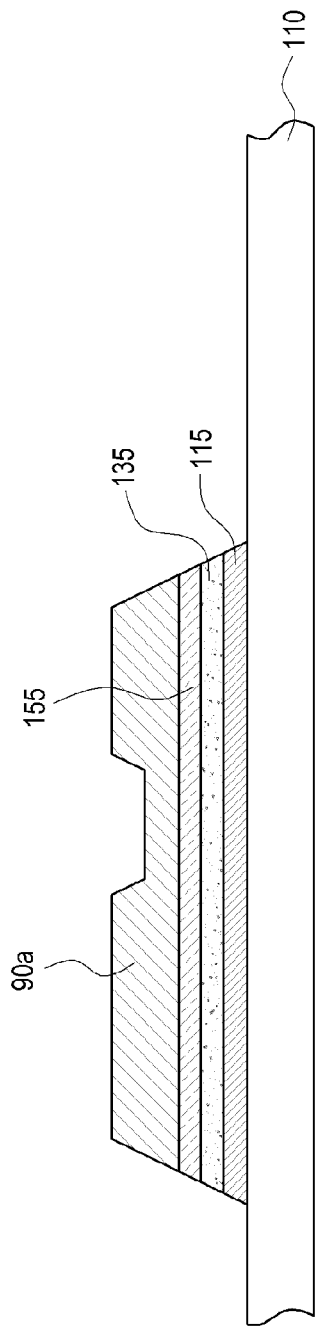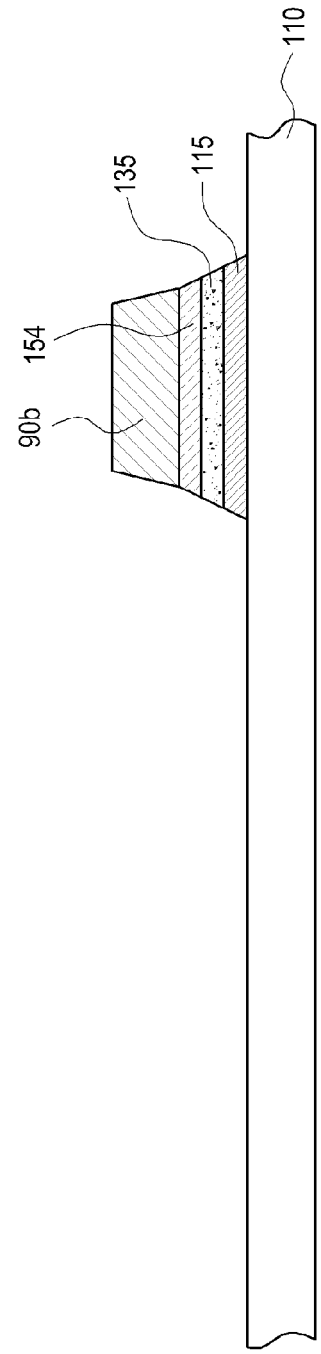
FIG.4A
FIG.4B

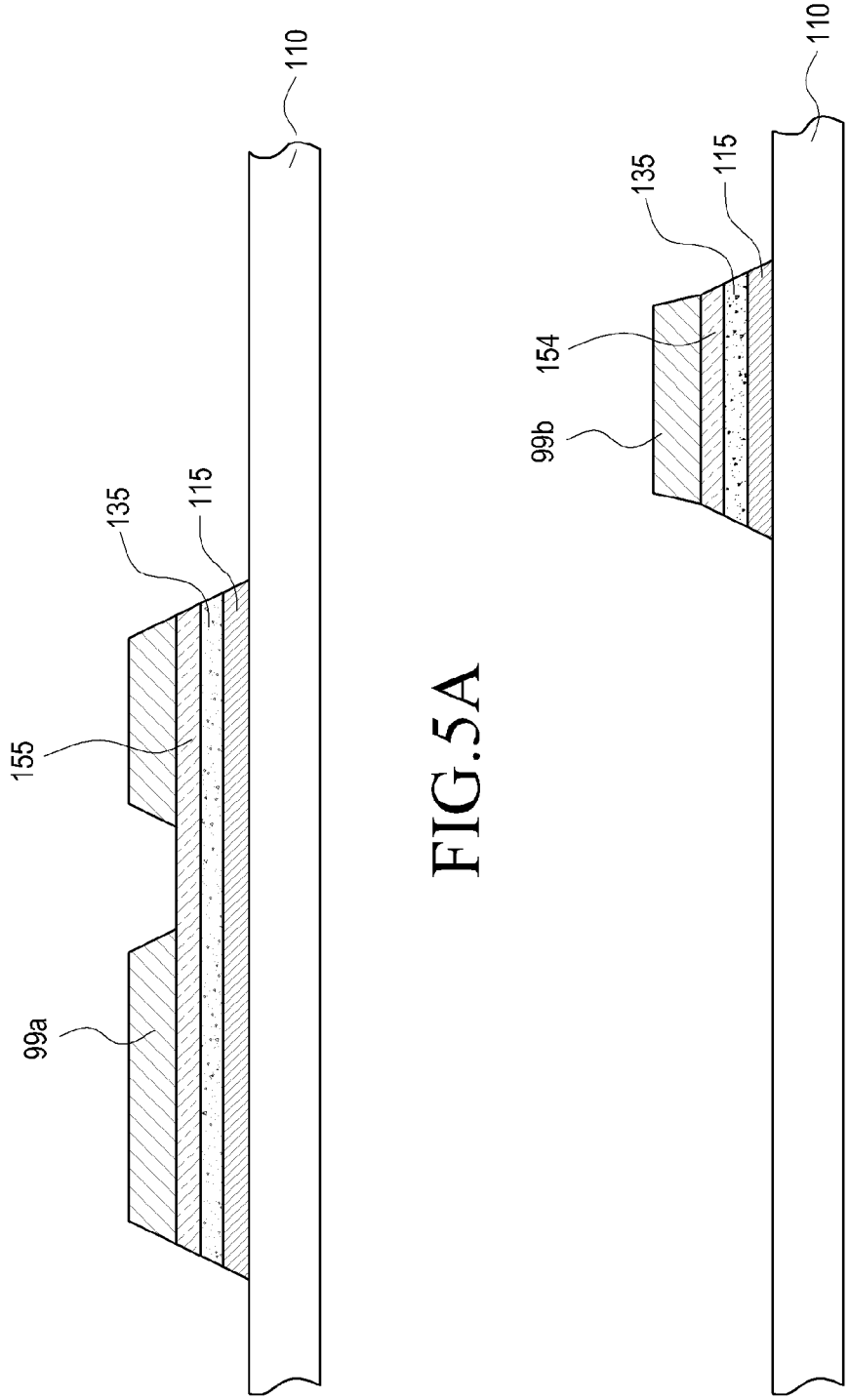

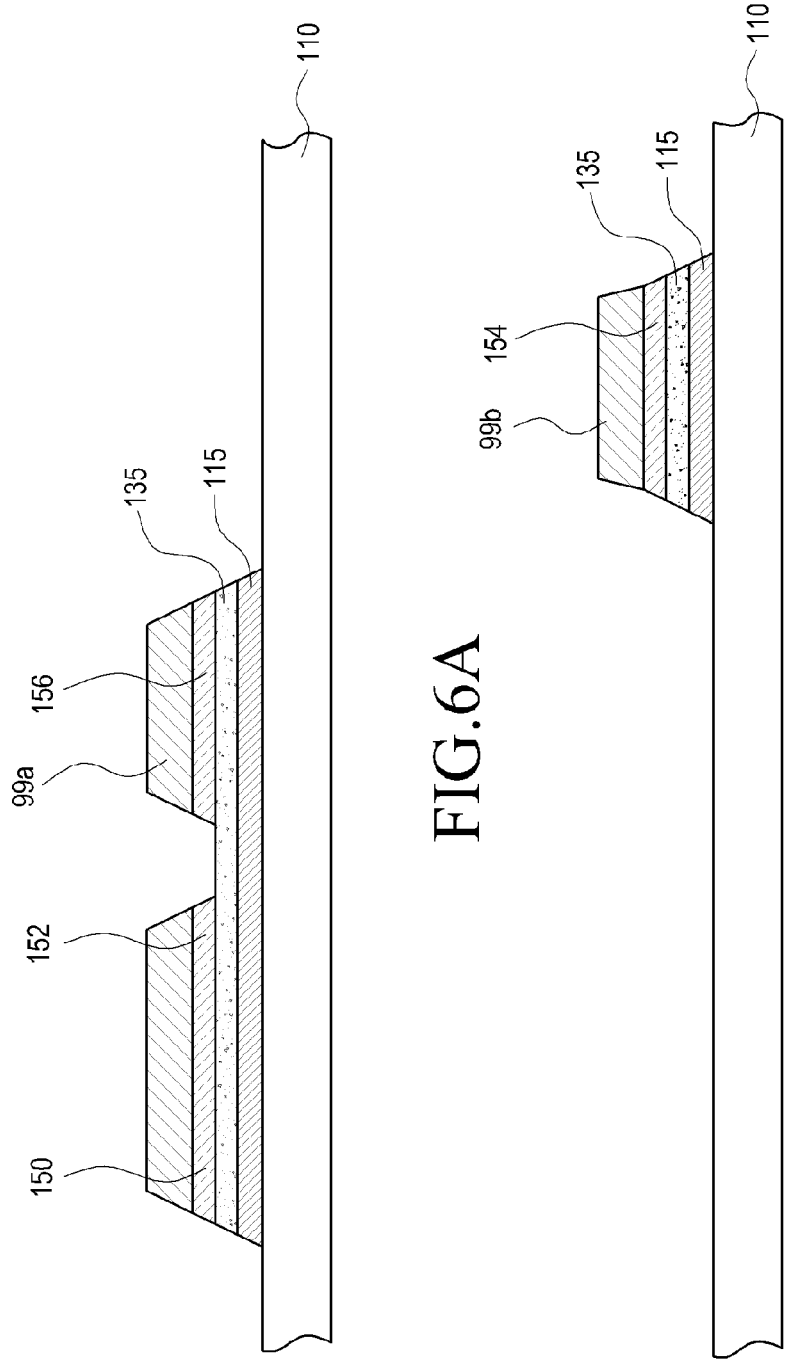

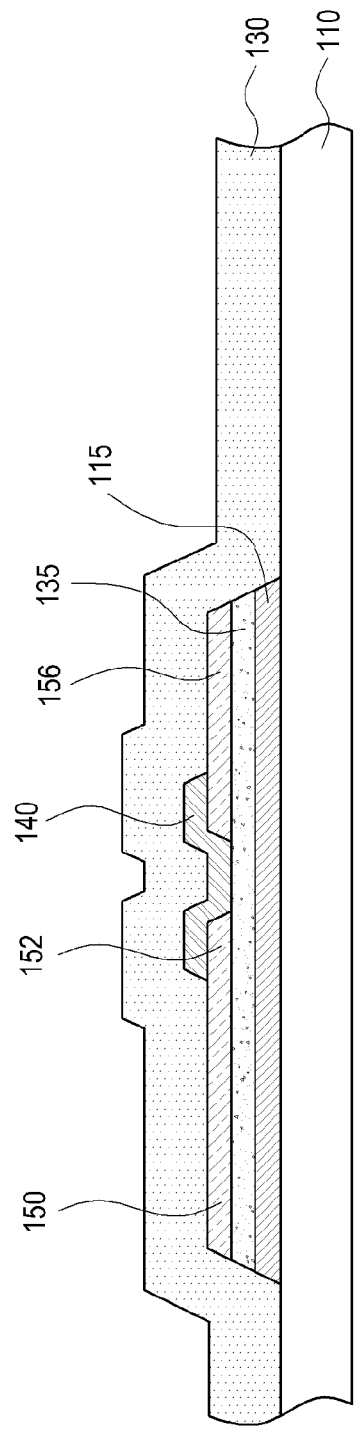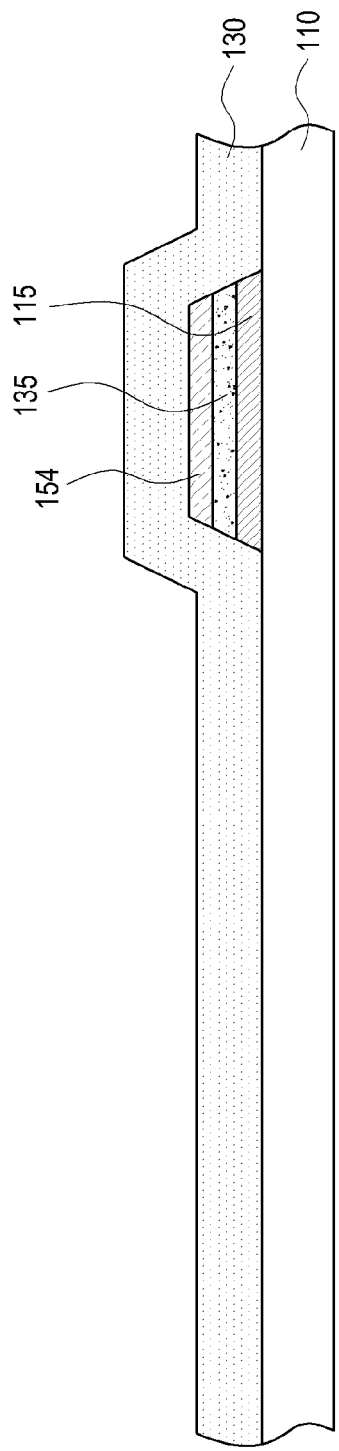

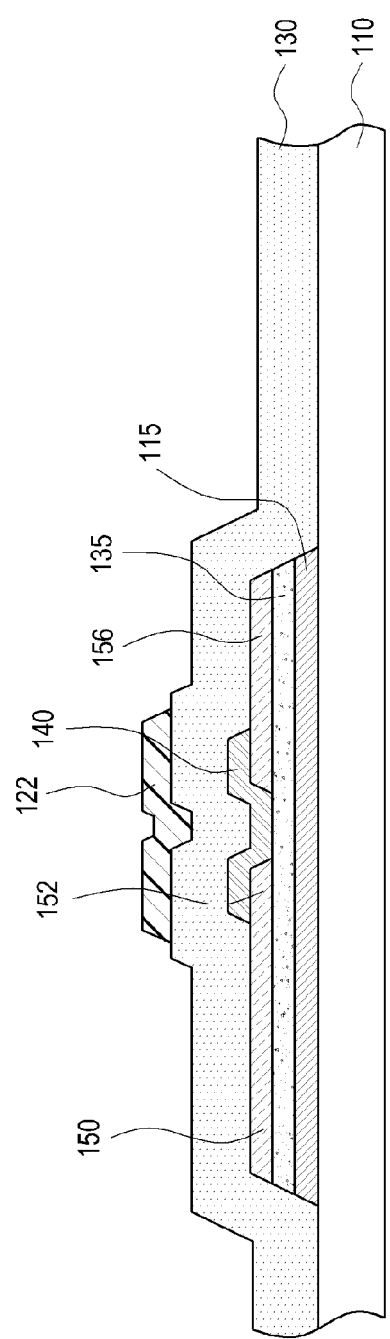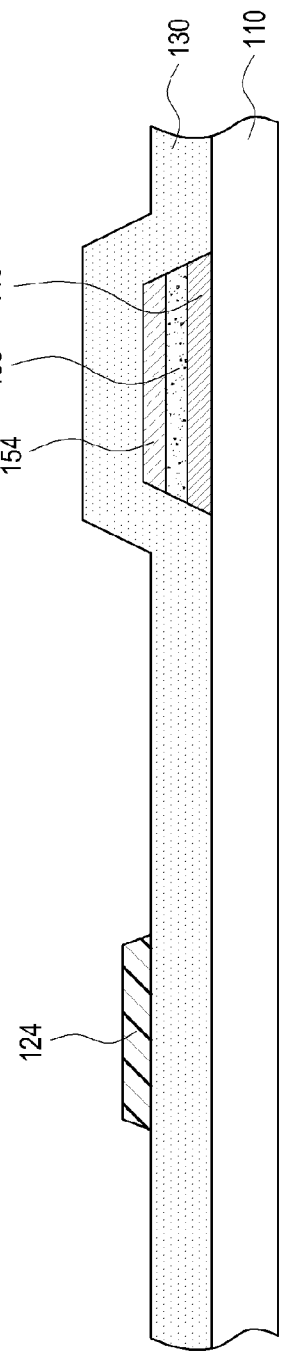
FIG.9A
FIG.9B

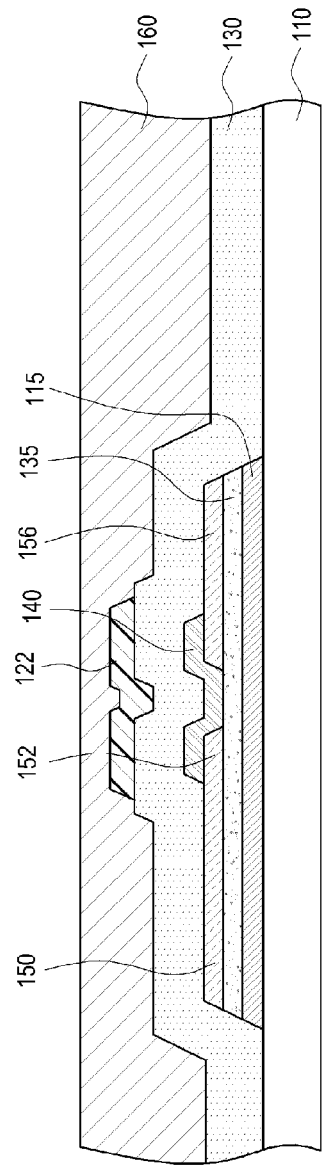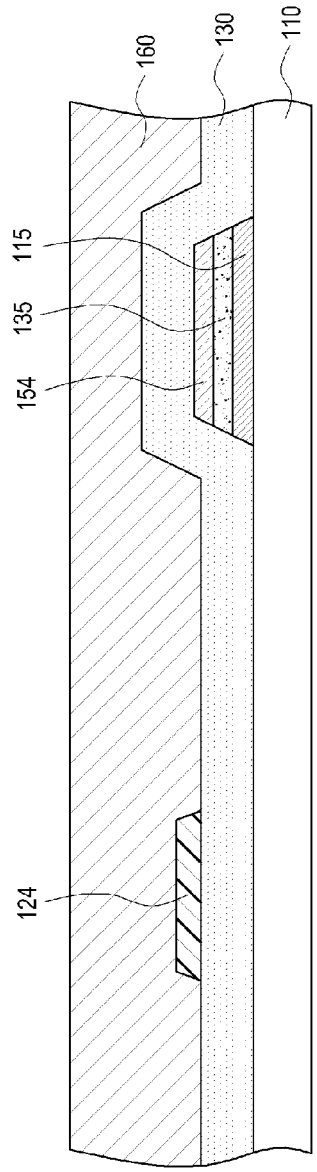
FIG.10A
FIG.10B

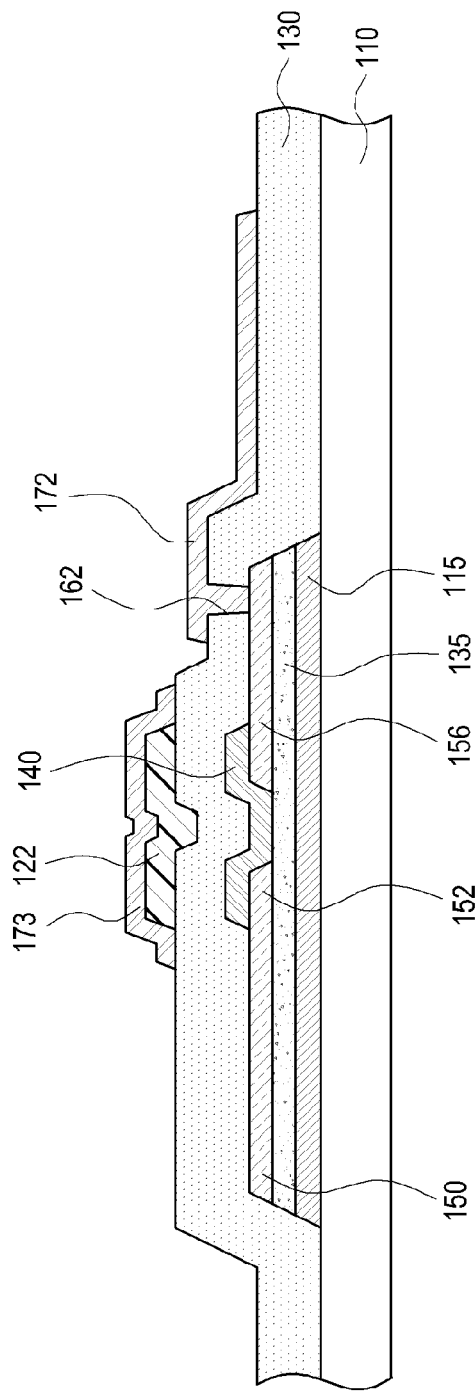
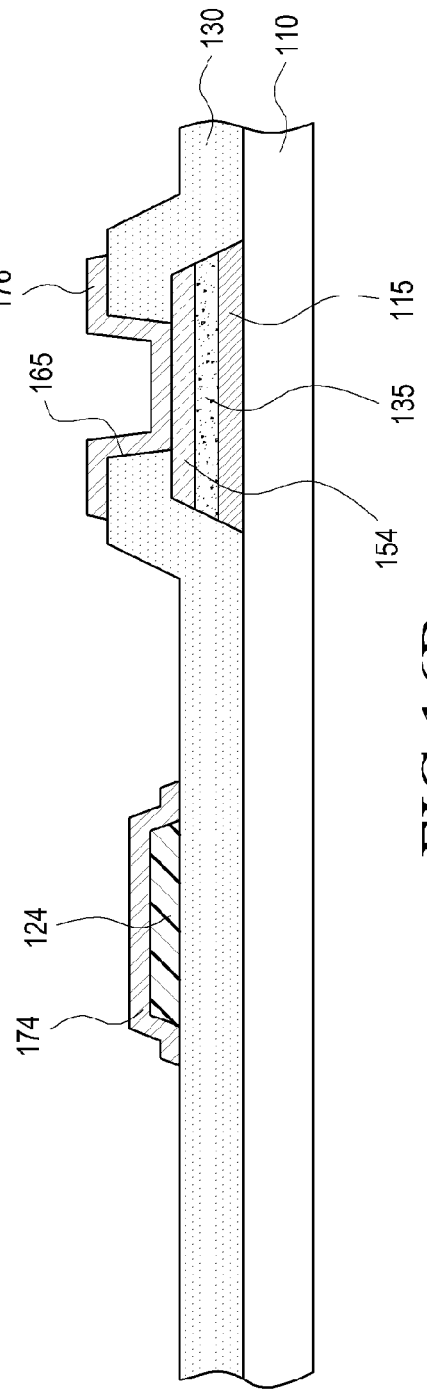
FIG.16A
FIG.16B

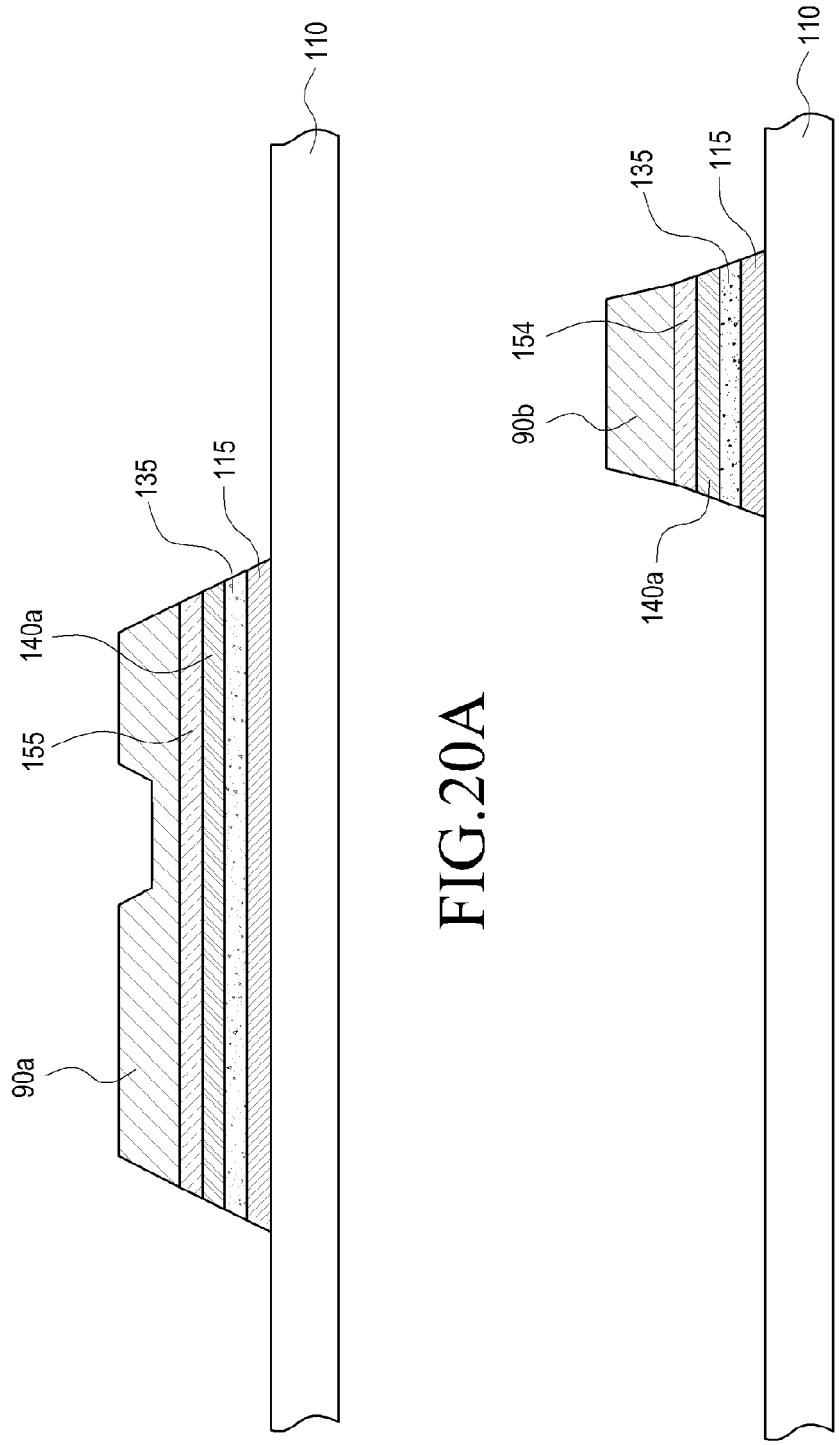

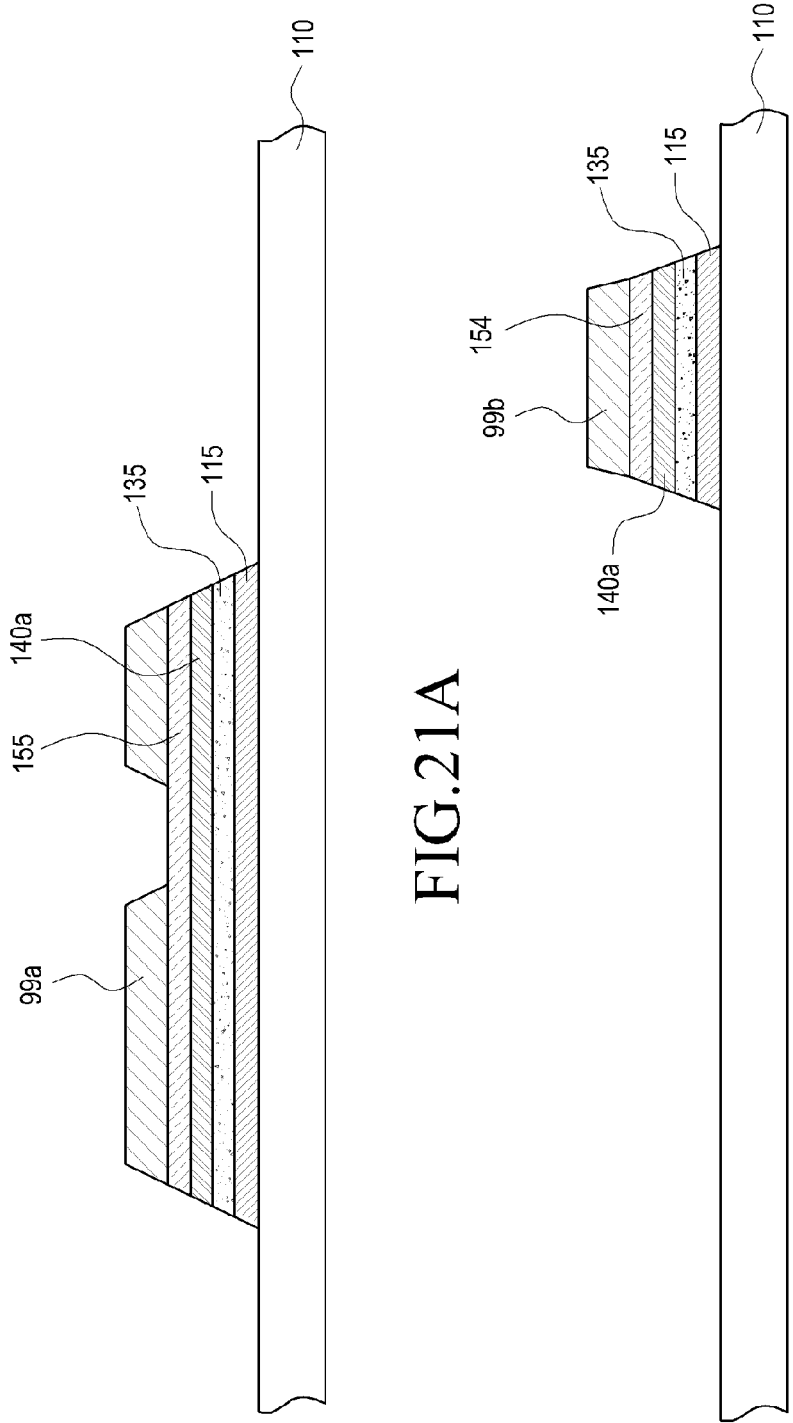

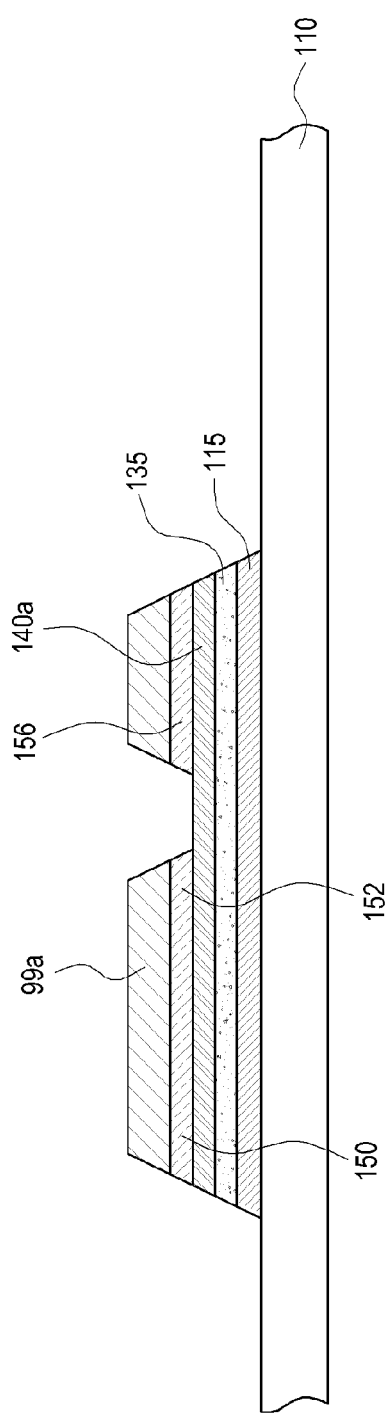
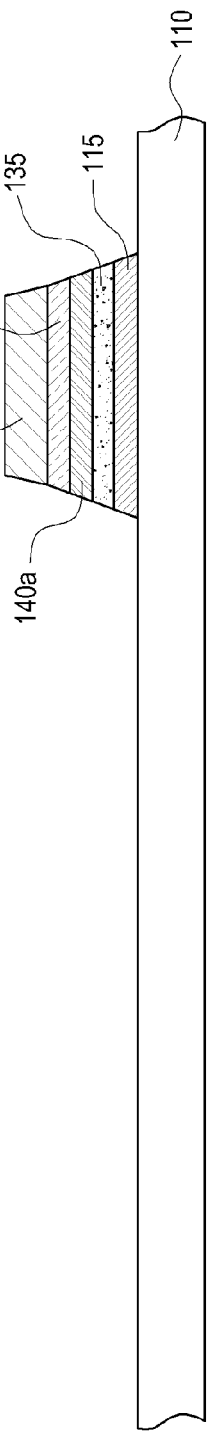
FIG.22A
FIG.22B

THIN FILM TRANSISTOR PANEL AND FABRICATING METHOD THEREOF

This application is a divisional of U.S. patent application Ser. No. 13/092,882, filed on Apr. 22, 2011, and claims priority under 35 U.S.C. §119(a) to Korean Patent Application No. 10-2010-0043212, filed on May 7, 2010, the disclosures of which are incorporated by reference herein in their entireties.

BACKGROUND

1. Technical Field

The invention relate to a thin film transistor, a thin film transistor panel and a fabricating method thereof.

2. Discussion of the Related Art

A flat panel display, such as a liquid crystal display ("LCD") or an organic light emitting display ("OLED"), typically includes a plurality of pixels. The pixels are arranged in a matrix on an insulating substrate such as glass or plastic. Each pixel includes pairs of field generating electrodes and an electro-optical active layer, such as liquid crystal molecules or a light emitting layer, interposed between each pair of field generating electrodes.

A pixel electrode, which is one of the electrodes in the pair of field generating electrodes, can be connected to a switching element that transmits electrical signals to the pixel electrode. The electro-optical active layer converts the electrical signal into an optical signal to display images.

A plurality of thin film transistors ("TFT") is typically used for the switching elements in the flat panel display. Each TFT typically includes a gate electrode, which receives a switching signal, a source electrode, which receives a data signal, and a drain electrode, which outputs the data signal to a pixel electrode. The TFT includes a semiconductor layer disposed between the source electrode and the drain electrode. Typically, an amorphous silicon layer has been used as the semiconductor layer. Recently, a TFT with high quality such as high driving speed is required for realizing a display device featuring a large size and highly resolution. Thus, an oxide semiconductor layer may be used instead of the amorphous silicon layer. Typically, a plurality of layers are deposited and then patterned, e.g., by photolithography processes using masks, thereby fabricating the TFT. In the event a TFT is fabricated using an oxide semiconductor layer, the oxide semiconductor layer can be damaged by a subsequent patterning process, thereby resulting in TFT degradation.

SUMMARY

An exemplary embodiment of the present invention provides a thin film transistor ("TFT") that may have an oxide semiconductor layer with reduced damage.

An exemplary embodiment of the present invention provides a TFT and a manufacturing method thereof to prevent the number of masks from increasing.

An exemplary embodiment of the present invention provides a TFT and a manufacturing method thereof that may reduce manufacturing time and cost.

Additional features of the invention will be set forth in the description which follows, and in part will be apparent from the description, or may be learned by practice of the invention.

An exemplary embodiment of the present invention provides a thin film transistor (TFT) panel in which damage to a TFT's oxide semiconductor layer can be reduced or prevented by reducing the number of photolithographic processes.

Additional features of the invention will be set forth in the description which follows, and in part will be apparent from the description, or may be learned by practice of the invention.

An exemplary embodiment of the present invention discloses a panel including a thin film transistor. The panel includes a substrate, a light blocking layer on the substrate, a first protective film on the light blocking layer, a first electrode and a second electrode on the first protective film, an oxide semiconductor layer on a portion of the first protective film exposed between the first electrode and the second electrode, an insulating layer, a third electrode overlapping with the oxide semiconductor layer and on the insulating layer, and a fourth electrode on the insulating layer.

The light blocking layer includes first sidewalls, and the first protective film includes second sidewalls. The first electrode includes third sidewalls, and the second electrode includes fourth sidewalls spaced apart from the first electrode. The oxide semiconductor layer is disposed on at least a portion of the third sidewalls, the fourth sidewalls, the first electrode, and the second electrode. The insulating layer is disposed on the oxide semiconductor layer, the first and the second electrodes, the first sidewalls, the second sidewalls, the third sidewalls, and the fourth sidewalls. The fourth electrode is connected to the second electrode. At least portions of the first and the second sidewalls are disposed along substantially the same line.

An exemplary embodiment of the present invention also discloses a method for forming a panel including a thin film transistor. The method includes forming a light blocking layer on a substrate, forming a first protective film on the light blocking layer, forming a first electrode and a second electrode on the first protective film and spaced apart from the each other, forming an oxide semiconductor layer on a portion of the first protective film exposed between the first electrode and the second electrode and on at least a portion of the first electrode and the second electrode, forming an insulating layer on the oxide semiconductor layer, the first electrode, and the second electrode, forming a third electrode overlapping with the oxide semiconductor layer and on the insulating layer, and forming a fourth electrode on the insulating layer, and connected to the second electrode. The light blocking layer, the first protective film, the first electrode, and the second electrode are formed using a single mask.

An exemplary embodiment of the present invention also discloses a panel including a thin film transistor. The panel includes a substrate, a light blocking layer on the substrate, a first protective film on the blocking layer, an oxide semiconductor layer on the first protective film, a first electrode and a second electrode spaced apart from each other on the oxide semiconductor layer, an insulating layer, a third electrode overlapping with the oxide semiconductor layer and on the insulating layer, and a fourth electrode on the insulating layer.

The light blocking layer includes first sidewalls, and the first protective film includes second sidewalls. The oxide semiconductor layer includes third sidewalls. The first electrode includes fourth sidewalls, and the second electrode includes fifth sidewalls. The insulating layer is disposed on the first electrode, the second electrode, the first, the second, the third, the fourth, and the fifth sidewalls. The fourth electrode is connected to the second electrode. At least portions of the first, the second, and the third sidewalls are disposed along substantially the same line.

An exemplary embodiment of the present invention also discloses a method for forming a panel including a thin film transistor. The method includes forming a light blocking layer on a substrate, forming a first protective film on the light blocking layer, forming an oxide semiconductor layer on the first protective film, forming a first electrode and a second electrode spaced apart from each other on the oxide semiconductor layer, forming an insulating layer on the oxide semiconductor layer, the first electrode, and the second electrode, forming a third electrode overlapping with the oxide semiconductor layer and on the insulating layer, and forming a fourth electrode on the insulating layer. The fourth electrode is connected to the second electrode. The light blocking layer, the first protective film, the oxide semiconductor layer, the first electrode, and the second electrode are formed using a single mask.

An exemplary embodiment of the present invention also discloses a panel including a thin film transistor. The panel includes a substrate, a first protective film on the substrate, a first electrode and a second electrode on the first protective film, an oxide semiconductor layer on the first electrode and the second electrode, an insulating layer on the oxide semiconductor layer, a third electrode overlapping with the oxide semiconductor layer and on the insulating layer, and a fourth electrode on the insulating layer.

The first and the second electrodes are spaced apart from each other to expose a portion of the first protective film. The oxide semiconductor layer is disposed on the exposed portion of the first protective film. The fourth electrode is connected to the second electrode. The first protective film includes opaque silicon oxide, opaque silicon nitride, or both opaque silicon oxide and opaque silicon nitride.

An exemplary embodiment of the present invention also discloses a method for forming a panel including a thin film transistor. The method includes forming a first protective film on a substrate, forming a first electrode and a second electrode on the first protective film, the first and the second electrodes spaced apart from each other to expose a portion of the first protective film, forming an oxide semiconductor layer on the first electrode, the second electrode, and the exposed portion of the first protective film, forming an insulating layer on the oxide semiconductor layer, the first electrode, and the second electrode, forming a third electrode on the insulating layer, and forming a fourth electrode on the insulating layer, the fourth electrode connected to the second electrode. The first protective film is formed to be opaque by controlling a partial pressure of nitrogen gas or oxygen gas.

An exemplary embodiment of the present invention also discloses a thin film transistor. The thin film transistor includes a substrate, a light blocking layer on the substrate, the light blocking layer including first sidewalls, a first protective film on the light blocking layer, the first protective film including second sidewalls, a first electrode and a second electrode on the first protective film and spaced apart from each other, the first electrode including third sidewalls and the second electrode including fourth sidewalls, an oxide semiconductor layer on a portion of the first protective film exposed between the first electrode and the second electrode, and on at least a portion of the third sidewalls, the fourth sidewalls, the first electrode, and the second electrode, an insulating layer on the oxide semiconductor layer, the first electrode, the second electrode, and the first, the second, the third, and the fourth sidewalls, and a third electrode overlapping with the oxide semiconductor layer and on the insulating layer. At least portions of the first sidewalls and the second sidewalls are disposed along substantially the same line.

An exemplary embodiment of the present invention also discloses a thin film transistor. The thin film transistor includes a substrate, a light blocking layer on the substrate, the light blocking layer including first sidewalls, a first protective film on the light blocking layer, the first protective film including second sidewalls, an oxide semiconductor layer on the first protective film, the oxide semiconductor layer including third sidewalls, a first electrode and a second electrode spaced apart from each other on the oxide semiconductor, the first electrode including fourth sidewalls and the second electrode including fifth sidewalls, an insulating layer on the first electrode, the second electrode, and the first, the second, the third, the fourth, and the fifth sidewalls, and a third electrode overlapping with the oxide semiconductor layer and on the insulating layer. At least portions of the first, the second, and the third sidewalls are disposed along substantially the same line.

An exemplary embodiment of the present invention also discloses a thin film transistor. The thin film transistor includes a substrate, a first protective film on the substrate, a first electrode and a second electrode on the first protective film, the first electrode and the second electrode spaced apart from each other to expose a portion of the first protective film, an oxide semiconductor layer on the exposed portion of the first protective film, and on at least a portion of the first electrode and the second electrode, an insulating layer on the oxide semiconductor layer, the first electrode, and the second electrode, and a third electrode overlapping with the oxide semiconductor layer and on the insulating layer. The first protective film includes opaque silicon oxide, opaque silicon nitride, or both opaque silicon oxide and opaque silicon nitride.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 3A, 4A, 5A, 6A, 7A, 8A, 9A, 10A, and 11A and FIGS. 3B, 4B, 5B, 6B, 7B, 8B, 9B, 10B, and 11B are cross-sectional views showing steps for manufacturing the TFT panel of FIGS. 2A and 2B, respectively.

FIGS. 16A and 16B are cross-sectional views taken along the lines XVIA-XVIA' and XVIB-XVIB' of FIG. 15, respectively.

FIGS. 19A, 20A, 21A, and 22A and FIGS. 19B, 20B, 21B, and 22B are cross-sectional views showing steps for manufacturing the TFT panels of FIGS. 18A and 18B, respectively.

DETAILED DESCRIPTION

Figure 1:
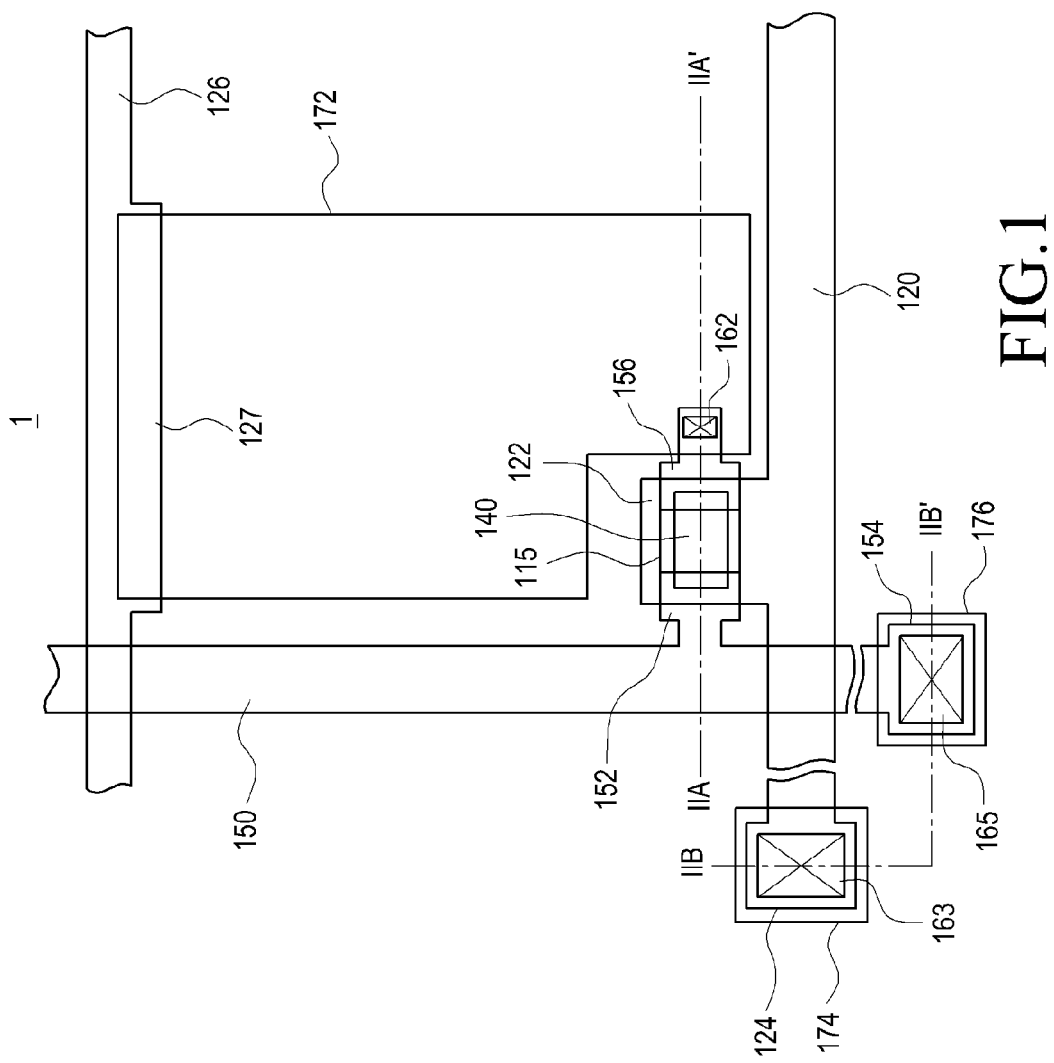
FIG. 1 is a plan view of a thin film transistor (TFT) panel according to an exemplary embodiment of the present invention.

Exemplary embodiments of the present invention now will be described more fully hereinafter with reference to the accompanying drawings. The exemplary embodiments of the present invention provide various numerals of thickness and size, however, it will be understood that the scope of this invention should not be limited by them without claiming them. Also, like reference numerals refer to like elements throughout.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that when at least two elements or layers are referred to as being "disposed along substantially the same line" or "arranged or aligned along substantially the same line", a distance between ends of sidewalls of two layers is less than or equal to 1 μm at a border or contact surface of the two layers.

It will be understood that "display area" refers to an area that is used to display an image. The display area includes a TFT and a pixel electrode.

It will be understood that "non-display area" refers to an area that is not used to display an image. A gate pad and a data pad are formed in the non-display area.

Hereinafter, exemplary embodiments of the present invention will be described in detail with reference to the accompanying drawings.

Figure 2A:
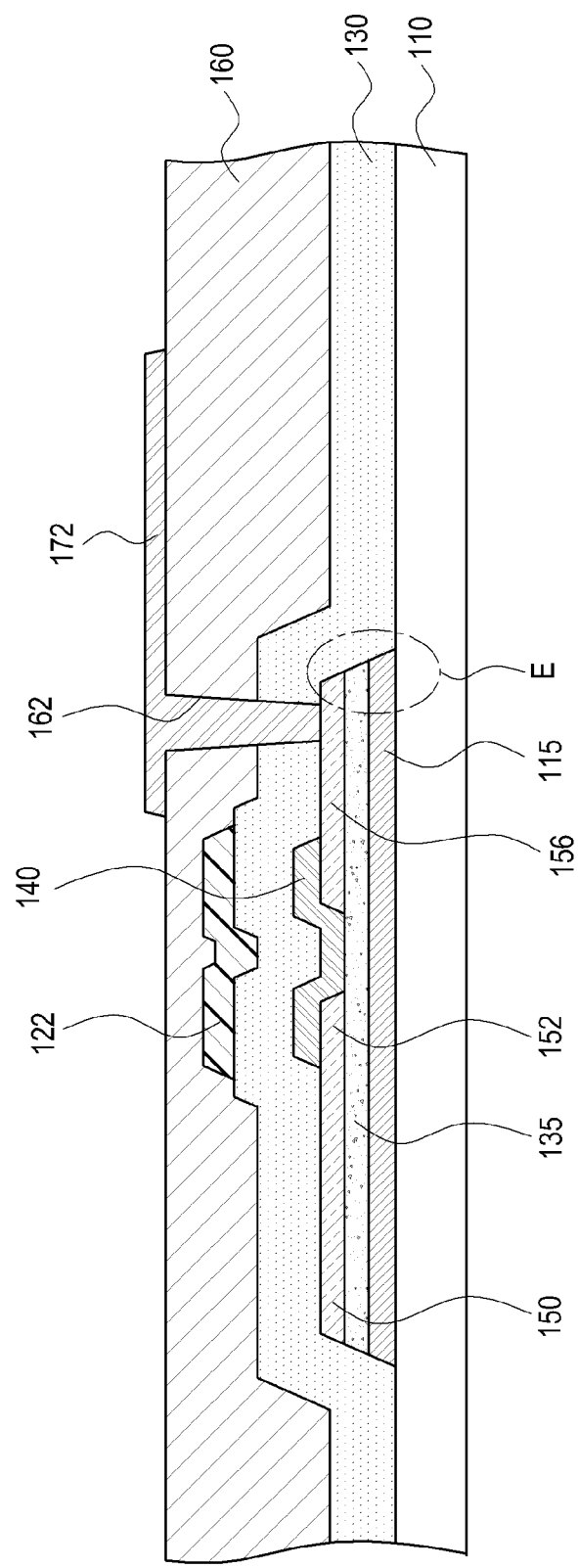
FIG. 2A and FIG. 2B are cross-sectional views taken along lines IIA-IIA' and IIB-IIB' of FIG. 1, respectively.
Figure 2B:
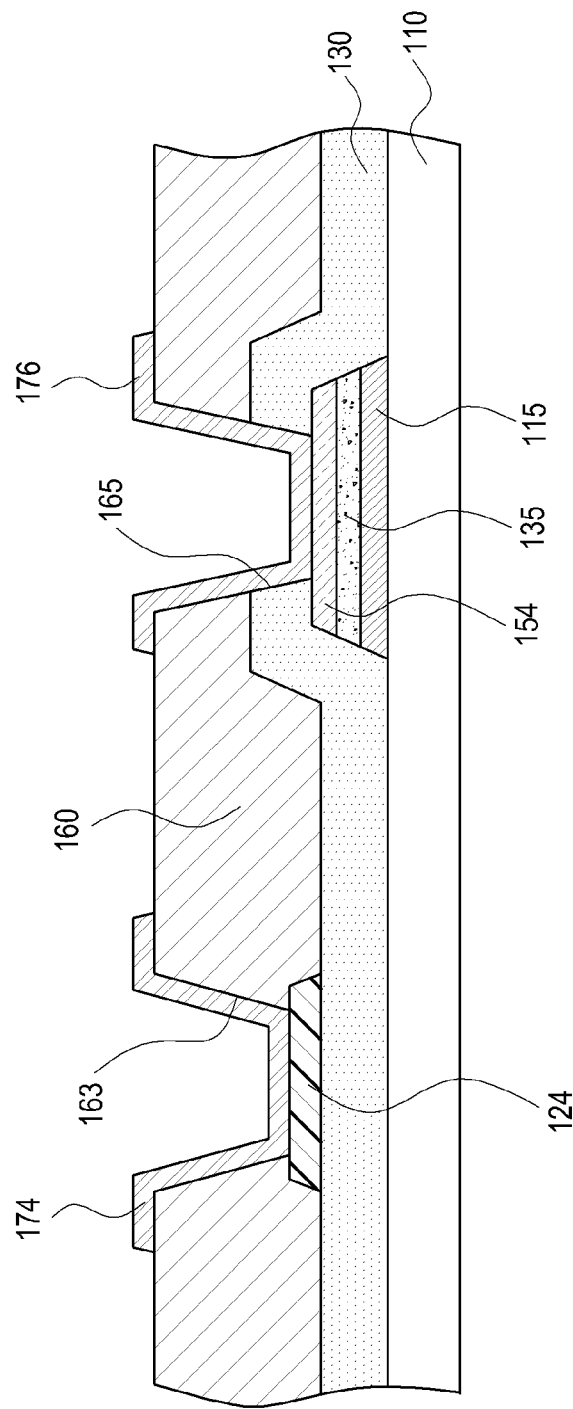

FIG. 1 is a plan view of a thin film transistor (TFT) panel 1 according to an exemplary embodiment the present invention. FIG. 2A is a cross-sectional view taken along line IIA-IIA' of FIG. 1, and FIG. 2B is a cross-sectional view taken along line IIB-IIB' of FIG. 1. While only a single pixel of the TFT panel 1 connected to a single TFT, a single gate line and a single data line are shown in FIG. 1, The TFT panel 1 may have multiple pixels connected to multiple TFTs, multiple gate lines and data lines and according to an exemplary embodiment of the present invention, they may be disposed in a matrix on the TFT panel 1. Furthermore, the pixels may have various structures. For example, each pixel may include more than one TFT and more than one pixel electrode.

Referring to FIG. 1 and FIG. 2A, a light blocking layer 115 having sidewalls is formed on an insulating substrate 110. The insulating substrate 110 can be made of glass, plastic, or other suitable insulating materials.

The light blocking layer 115 can include an opaque inorganic material or an opaque organic material. For example, the opaque inorganic material can include at least one of chrome, chrome oxide or combinations thereof. The opaque organic material can include an organic photo-sensitive resin and at least one of carbon black, titanium oxide ($TiO_2$), color pigment, or combinations thereof. The light blocking layer 115 prevents light from entering an oxide semiconductor layer 140 as described in detail below, thereby reducing leakage current generated in the oxide semiconductor layer 140.

A first protective film 135 having sidewalls connecting top and bottom surfaces of the first protective film 135 is formed on the light blocking layer 115. The first protective film 135 can include silicon oxide ($SiO_x$). The first protective film 135 protects the oxide semiconductor layer 140 from external impurities. Also, the first protective film 135 stabilizes interface characteristic of the oxide semiconductor layer 140 by contacting the oxide semiconductor layer 140 to improve performance of a TFT. When the light blocking layer 115 is formed of chrome, the first protective film 135 can electrically insulate a source electrode and a drain electrode of a TFT from the light blocking layer 115.

A data line 150, which includes a source electrode 152, and a drain electrode 156 are formed on the first protective film 135. The data line 150, which extends in a longitudinal or column direction, transmits data signals. The data line 150 includes the source electrodes 152 that protrude from the data line 150. A data pad 154 is formed at the end of the data line 150. A driving circuit, such as a data driving circuit, applies driving signals to the data pad 154. The drain electrode 156 is spaced apart from the source electrode 152, and the oxide semiconductor layer 140 is disposed there between.

The data line 150 and the drain electrode 156 can be formed of a single layer or double layer including at least one of Ni, Ti, Ag, Cu, Mo, Al, Nb, Au, Ta, an alloy thereof, or combinations thereof.

When the oxide semiconductor layer 140 directly contacts with Al, Cu, Ag, or alloys thereof, the data line 150 and the drain electrode 156 can be formed of a double layered structure or a triple layered structure for improving contact properties between the oxide semiconductor 140 and the data line 150 and the drain electrode 158. For example, the double layered structure can be formed of Al/Mo, Al/Ti, Al/Ta, Al/Ni, Al/TiNx, Al/Co, Cu/CuMn, Cu/Ti, Cu/TiN, or Cu/TiOx. For example, the triple layered structure can be formed of Mo/Al/Mo, Ti/Al/Ti, Co/Al/Co, Ti/Al/Ti, TiNx/Al/Ti, CuMn/Cu/CuMn, Ti/Cu/Ti, TiNx/Cu/TiNx, or TiOx/Cu/TiOx.

Here, the first protective film 135 can overlap with the light blocking layer 115. In other words, the first protective film 135 and the light blocking layer 115 may have substantially the same pattern as each other. The sidewalls of the first protective film 135 and the light blocking layer 115, which are located in the same direction, are disposed along substantially the same line.

The oxide semiconductor layer 140 is formed on a portion of the source electrode 152, a portion of the drain electrode 156, and a portion of the first protective film 135 exposed there between.

The oxide semiconductor layer 140 may include one or more compounds represented by the formulas $A_xB_xO_x$ and $A_xB_xC_xO_x$. Here, A may be In, Zn, Ga, Hf, or Cd; B may be Zn, Ga, Sn, or In; C may be Sn, Zn, Cd, Ga, In, or Hf; and O is atomic oxygen. Each x is independently a non-zero integer, and A, B, and C are different from one another. For example, the oxide semiconductor layer 140 can include one or more of the following compounds: InZnO, InGaO, InSnO, ZnSnO, GaSnO, GaZnO, GaZnSnO, GaInZnO, HfInZnO, HfZnSnO, and ZnO. The effective carrier mobility of an oxide semiconductor may be one to two hundred times greater than that of amorphous silicon, thereby causing a TFT's driving speed to increase. A channel region is formed in a portion of the oxide semiconductor 140 between the source electrode 152 and the drain electrode 156.

A gate insulating layer 130 is formed on the oxide semiconductor 140, the data line 150, the drain electrode 156, the sidewalls of the light blocking layer 115 and the first protective film 135. The gate insulating layer 130 can include multiple layers made of various insulating materials. For example, the gate insulating layer 130 can include silicon nitride (SiNx), silicon oxide (SiOx), or silicon oxynitride (SiON). For an example of the gate insulating layer 130 including multiple layers, the gate insulating layer 130 can include a double-layered structure of a lower layer of SiOx contacting the oxide semiconductor layer 140 and an upper layer of SiNx.

A plurality of the gate lines 120 and storage electrode lines 126 is formed on the gate insulating layer 130. The gate lines 120 extend in a transverse direction. Each gate line 120 includes gate electrodes 122 vertically protruded from the gate line 120. A gate pad 124 is formed at the end of the gate line 120, which receives gate signals.

The storage electrode lines 126 may receive a preset voltage and extend parallel with the gate lines 120. Each storage electrode line 126 includes storage electrodes 127 that overlap portions of a pixel electrode 172 to form storage capacitors. The gate line 120 and the storage electrode line 126 may include at least one of silver (Ag) or silver alloy, copper (Cu) or copper alloy, molybdenum (Mo) or molybdenum alloy, chromium (Cr), tantalum (Ta), titanium (Ti), or combinations thereof. According to an exemplary embodiment, the gate lines 120 and the storage electrode lines 126 can include multiple layers made of various conductive materials. For example, they may include a double-layered structure such Al and Mo or Ti and Cu.

As shown in FIG. 1 and FIG. 2, the sidewalls of the gate electrode 122 are disposed outside the sidewalls of the oxide semiconductor layer 140. The gate electrode 122 can overlap the oxide semiconductor layer 140. The right and left sidewalls of the gate electrode 122 are partially inside the right and left sidewalls of the first protective film 135. The upper sidewall of the gate electrode 122 is outside the sidewall of the first protective film 135, thereby stabilizing a manufacturing process.

A second protective film 160 is formed on the gate lines 120, the gate electrodes 122, and the gate insulating layer 130. The second protective film 160 can include SiOx, SiNx, or an organic material such as acrylate. Referring to FIGS. 1, 2A, and 2B, the second protective film 160 and the gate insulating layer 130 have a drain contact hole 162 to expose a portion of the drain electrode 156 and a data pad contact hole 165 to expose a portion of the data pad 154. The second protective film 160 has a gate pad contact hole 163 to expose a portion of the gate pad 124.

A pixel electrode 172 is formed on the second protective film 160. The pixel electrode 172 is electrically connected to the drain electrode 156. The pixel electrode 172 can include a transparent conductive material such as indium tin oxide (ITO) or indium zinc oxide (IZO), or reflective metal such as Al, Ag, Cr or alloys thereof. The pixel electrode 172 receives a data signal from the drain electrode 156. A pair of a pixel electrode and a common electrode face each other and generate an electrical field there between. A liquid crystal display device includes liquid crystal molecules between the pixel and common electrodes. The liquid crystal molecules are oriented by the generated electrical field, thereby controlling light transmittance.

The pixel electrode 172 partially overlaps the storage electrode line 126 at the storage electrode 127 to form the storage capacitor. The storage capacitor maintains a voltage between the pixel electrode 172 and the common electrode. The gate insulating layer 130 and the second protective film 160 can be disposed between the pixel electrode 172 and the storage electrode line 126.

FIGS. 3A to 11B are cross-sectional views showing steps for manufacturing the TFT panel of FIGS. 1, 2A, and 2B according to an exemplary embodiment of the present invention. In detail, FIGS. 3A, 4A, 5A, 6A, 7A, 8A, 9A, 10A, and 11A are diagrammatical views showing steps for manufacturing the TFT panel of FIG. 2A, and FIGS. 3B, 4B, 5B, 6B, 7B, 8B, 9B, 10B, and 11B are diagrammatical views showing steps for manufacturing the TFT panel of FIG. 2B.

Referring to FIGS. 3A and 3B, a light blocking material 112, a protective layer 132, and a data conductive layer 151 are formed on the surface of an insulating substrate 110. The insulating substrate 110 can include glass or plastic.

The light blocking material 112 can include an opaque inorganic material or an opaque organic photo-sensitive resin. In one embodiment, the light blocking material 112 has a thickness in the range of about 500 Å to 5000 Å. When the light blocking material 112 includes an inorganic material such as chrome, a sputtering technique can be used. When the light blocking material 112 includes an organic photo-sensitive resin, a slit coating technique can be used.

The protective layer 132 can include silicon oxide (SiOx) or silicon nitride (SiNx) and can be formed by a chemical vapor deposition (CVD) or sputtering technique. In one embodiment, the protective layer 132 can have a thickness in the range of 300 Å to 5000 Å. A formation of silicon oxide (SiOx) or silicon nitride (SiNx) by sputtering technique can be performed using a silicon (Si) target in an atmosphere of oxygen ($O_2$) or nitrogen ($N_2$). In this case, light transmittance of silicon oxide (SiOx) or silicon nitride (SiNx) film can be controlled by adjusting the partial pressure of oxygen ($O_2$) or nitrogen ($N_2$).

TABLE 1

| | $N_2/(N_2 + Ar)$ | | | | | |
|---|---|---|---|---|---|---|
| | 0.1 | 0.2 | 0.3 | 0.4 | 0.5 | 0.6 |
| Light transmittance | 0.0% | 0.1% | 0.1% | 0.3% | 1.4% | 94.2% |

For example, Table 1 shows transmittance of light with 550 nm wavelength along ratio variation of nitrogen ($N_2$) flow rate to total flow rate of nitrogen ($N_2$) and argon (Ar). When the ratio is 0.5, the light transmittance is 1.4%. When the ratio is 0.6, the light transmittance is 94.2%. In other words, where the ratio is below or equal to 0.5, opaque silicon nitride may be formed. Accordingly, when opaque silicon oxide or opaque silicon nitride is formed as the protective layer 132 using a sputtering technique, the light blocking material 112 can be omitted.

The data conductive layer 151 can be formed using a sputtering technique. The thickness of the data conductive layer 151 can vary depending on material type thereof. For example, when the data conductive layer 151 is a double layered structure of Cu/Ti, Cu can have a thickness in the range of 2000 Å to 10000 Å, and Ti can have a thickness in the range of 100 Å to 1000 Å.

A photo-resist (not shown) is coated on the data conductive layer 151 using a slit coating technique and patterned using a photolithography process using a half-tone or slit mask to form a first photo-resist pattern 90a with a step portion and a first photo-resist pattern 90b without a step portion. The first photo-resist pattern 90a with a step portion is formed in the area corresponding to a channel between the source electrode 152 and the drain electrode 156, the data line 150 having the source electrode 152, and the drain electrode 156 of FIGS. 1, 2A and 2B. The first photo-resist pattern 90b without a step portion is formed in the area corresponding to the data pad 154. The portion of the first photo-resist pattern 90a in the area corresponding to the channel is thinner than other portions of the first photo-resist pattern 90a.

Referring to FIGS. 4A and 4B, the data conductive layer 151, the protective layer 132, and the light blocking material 112 are patterned using the first photo-resist pattern 90a and 90b as an etching mask to form a data conductive pattern 155, a first protective film 135, a light blocking layer 115, and a data pad 154. The first protective film 135 and the light blocking layer 115 have sidewalls.

The patterning method of the data conductive layer 151 can be adjusted depending on the material thereof. In one embodiment, when the data conductive layer 151 is formed of Mo/Al/Mo, it can be etched by a wet etching process using an etchant of phosphoric acid, nitric acid, and acetic acid. For example, a ratio of mixed solution of phosphoric acid, nitric acid, and acetic acid can be 73.4:5.4:4.0. In another embodiment, when the data conductive layer 151 is formed of Cu/Ti, it can be etched by a wet etching process using an etchant of ammonium persulfate, nitric acid, aminotetrazole, and methanesulfonic acid. For example, a ratio of mixed solution of ammonium persulfate, nitric acid, aminotetrazole, and methanesulfonic acid can be 12:2:1:0.1.

The protective layer 132 formed of silicon oxide or silicon nitride can be patterned by a dry etching process using a mixture gas including $SF_6$ or $C_4F_8$ and $O_2$. For example, a ratio of $SF_6$ and $O_2$ can be 4:1, and a ratio of $C_4F_8$ and $O_2$ can be 3:1.

The light blocking material 112 formed of chrome can be etched by a wet etching process using an etchant including ceric ammonium nitrate and nitric acid. For example, a ratio of ceric ammonium nitrate and nitric acid can be 10:5 or 14:10.

Referring to FIGS. 5A and 5B, the step portion of the first photo-resist pattern 90a and a portion of the first photo-resist pattern 90b are removed using an ashing process to form a second photo-resist pattern 99a and 99b. The step portion of the first photo-resist pattern 90a and 90b corresponding to the channel area is removed to expose a portion of the data conductive pattern 155. Consequently, the remaining portions of the first photo-resist pattern 90a and 90b becomes the second photo-resist pattern 99a and 99b. The second photo-resist pattern 99a and 99b is thinner than the first photo-resist pattern 90a and 90b.

Referring to FIGS. 6A and 6B, a portion of the data conductive pattern 155 corresponding to the channel area is removed by etching the data conductive pattern 155 as noted above to form a data line 150, which includes a source electrode 152 and a data pad 154, and a data electrode 156. The data line 150 and the drain electrode 156 have sidewalls.

Figure 7A:
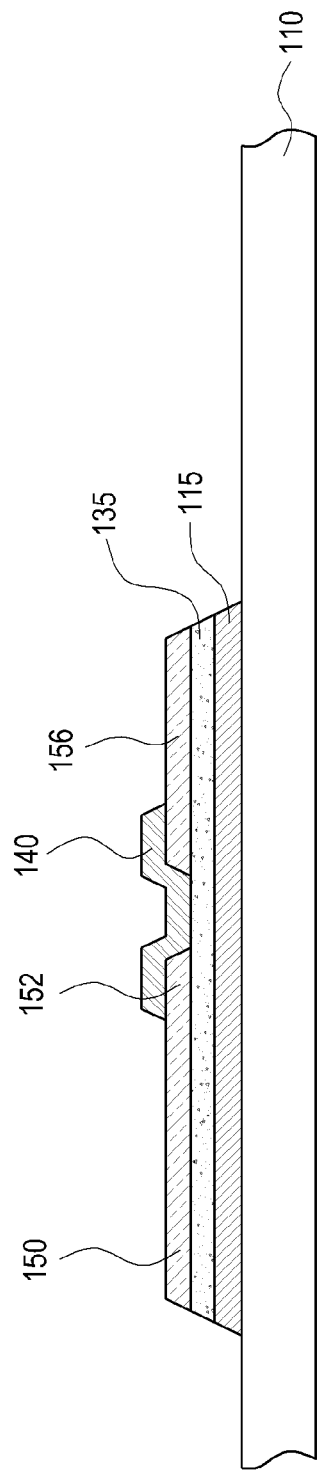
Figure 7B:
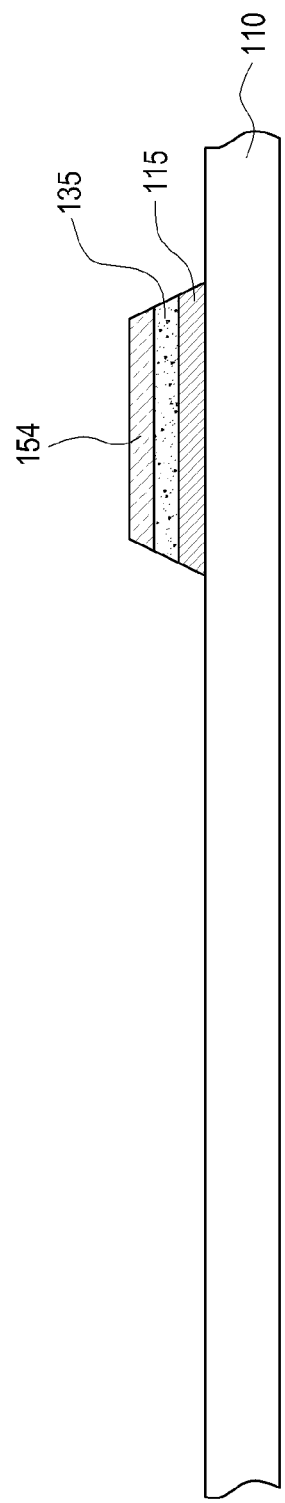

Referring to FIGS. 7A and 7B, the second photo-resist pattern 99a and 99b is removed and then an oxide semiconductor layer 140 is formed on the data line 150 including the source electrode 152 and the data pad 154, the drain electrode 156, and the first protective film 135 exposed between the source electrode 152 and the drain electrode 156. In other words, an oxide semiconductor material (not shown) is formed on the surface of the data line 150, the drain electrode 156, the first protective film 135 between the source electrode 152 and the drain electrode 156, sidewalls thereof, and the insulating substrate 110. The oxide semiconductor material is patterned using a photo-lithography process to form the oxide semiconductor 140. The oxide semiconductor layer 140 may include one or more compounds represented by the formulas $A_XB_XO_X$ and $A_XB_XC_XO_X$. Here, A may be In, Zn, Ga, Hf, or Cd; B may be Zn, Ga, Sn, or In; C may be Sn, Zn, Cd, Ga, In, or Hf; and O is atomic oxygen. Each x is independently a non-zero integer, and A, B, and C are different from one another. For example, the oxide semiconductor layer 140 can include one or more of the following compounds: InZnO, InGaO, InSnO, ZnSnO, GaSnO, GaZnO, GaZnSnO, GaInZnO, HfInZnO, HfZnSnO, and ZnO.

Referring to FIGS. 8A and 8B, a gate insulating layer 130 is formed on the data line 150 including the source electrode 152 and the data pad 154, the drain electrode 156, the oxide semiconductor layer 140, and the insulating substrate 110. The gate insulating layer 130 is formed by chemical vapor deposition. The gate insulating layer 130 can be formed of silicon nitride (SiNx), silicon oxide (SiOx), or silicon oxynitride (SiON). In one embodiment, the gate insulating layer 130 can have a double-layered structure including a lower silicon oxide and silicon nitride on the lower silicon oxide.

Referring to FIGS. 9A and 9B, a gate conductive layer (not shown) is formed on the gate insulating layer 130 using a sputtering technique. The gate conductive layer is patterned using a photolithography process to form a gate line 120 including a gate electrode 122 and a gate pad 124 and a storage electrode line 126 of FIG. 1.

The gate line 120 and the storage electrode line 126 may include at least one of silver (Ag) or silver alloy, copper (Cu) or copper alloy, molybdenum (Mo) or molybdenum alloy, chromium (Cr), tantalum (Ta), or titanium (Ti). According to an exemplary embodiment, the gate lines 120 and the storage electrode lines 126 can include multiple layers made of various conductive materials. For example, they may include a double-layered structure such Al and Mo or Ti and Cu.

Referring to FIGS. 10A and 10B, a second protective film 160 is formed on the gate line 120, the storage electrode line 126, and the gate insulating layer 130. The second protective film 160 can include silicon oxide (SiOx), silicon nitride (SiNx), or an organic layer, and it can be formed by chemical vapor deposition or slit coating.

Figure 11A:
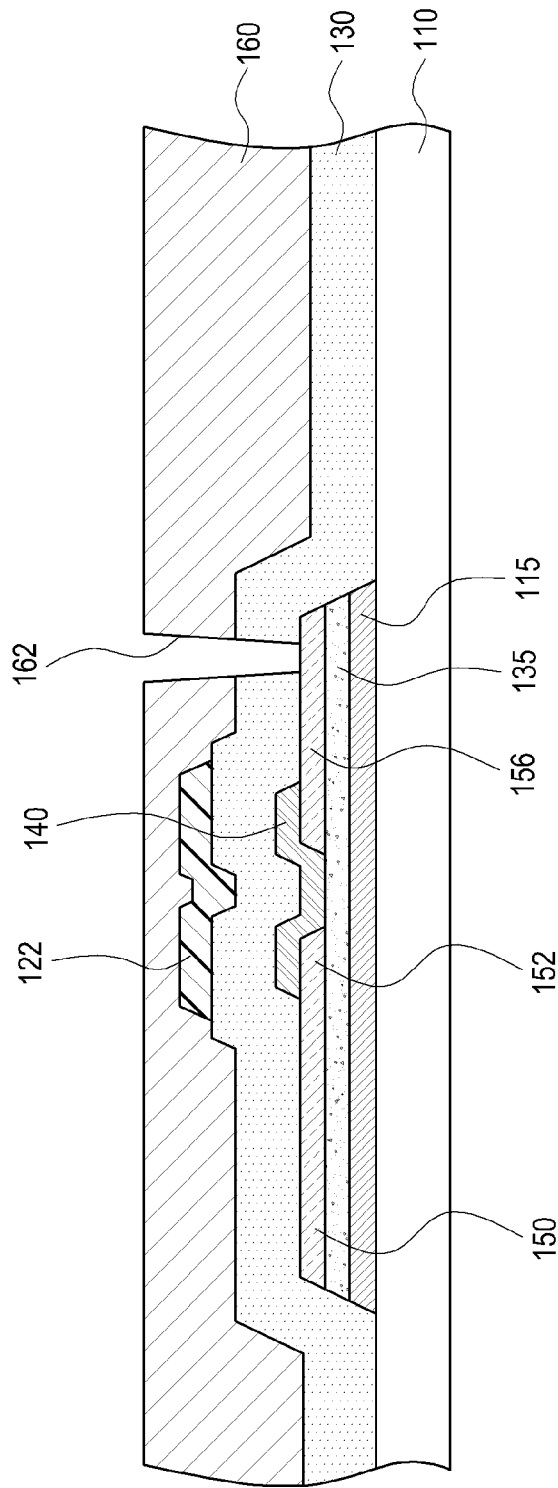
Figure 11B:
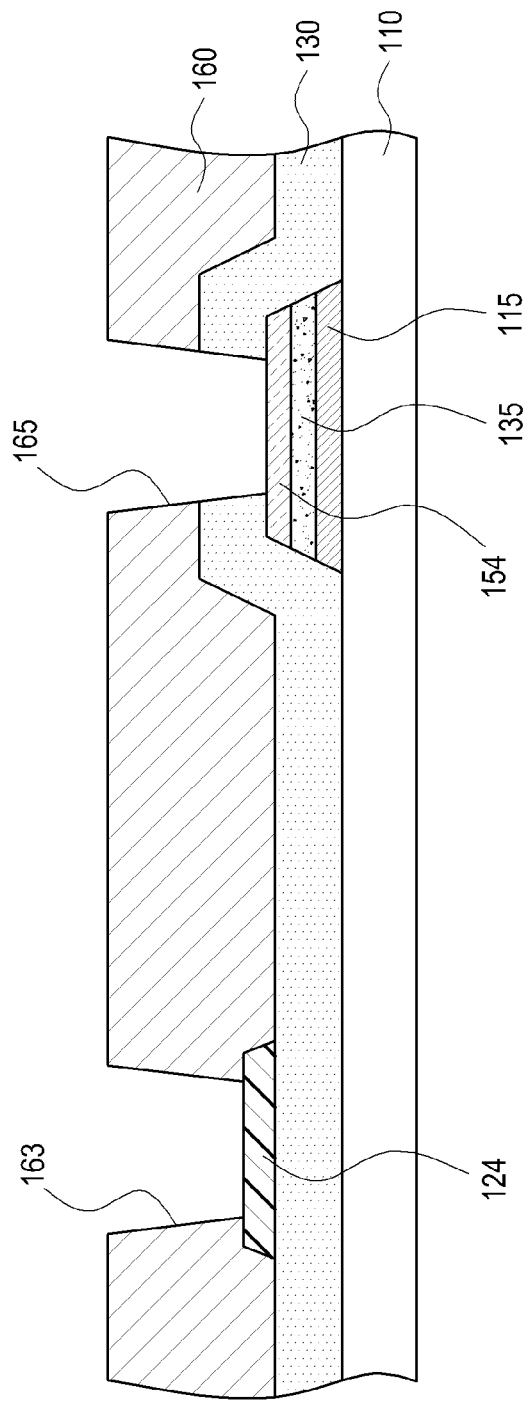

Referring to FIGS. 11A and 11B, a drain contact hole 162, a gate pad contact hole 163, and a data pad contact hole 165 are formed in the second protective film 160 and the gate insulating layer 130 using a photolithography process. The drain contact hole 162 is formed through the second protective film 160 and the gate insulating layer 130 to expose a portion of the drain electrode 156. The gate pad contact hole 163 is formed through the second protective film 160 to expose a portion of the gate pad 124, which is connected to a gate driving circuit. The data pad contact hole 165 is formed through the second protective film 160 and the gate insulating layer 130 to expose a portion of the data pad 154, which is connected to a data driving circuit.

Again, referring to FIGS. 2A and 2B, a transparent conductive layer (not shown) is formed on the second protective film 160 including the drain contact hole 162, the gate pad contact hole 163, and the data pad contact hole 165 using a sputtering technique. The transparent conductive layer is patterned using a photolithography process to form a pixel electrode 172, a first contact assistant 174, and a second contact assistant 176. The transparent conductive layer can include a transparent conductor such as indium tin oxide (ITO) or indium zinc oxide (IZO). Alternatively, a reflective conductor such as aluminum (Al) can be used. The pixel electrode 172 is electrically connected to the drain electrode 156 through the drain contact hole 162. The first contact assistant 174 is electrically connected to the gate pad 124 through the gate pad contact hole 163. The second contact assistant 176 is electrically connected to the data pad 154 through the data pad contact hole 165.

The first contact assistant 174 and the second contact assistant 176 prevent the gate pad 124 and the data pad 154 from being corroded.

According to this exemplary embodiment of the invention, the oxide semiconductor layer 140 is formed after forming the data line 150 and the drain electrode 156, thereby reducing damage to the oxide semiconductor layer 140 caused from an etching process of the data line 150 and the drain electrode 156. Also, the gate insulating layer 130 protects the oxide semiconductor layer 140, thereby preventing damage to the oxide semiconductor layer 140 caused during the formation of the gate electrode 122.

In addition, the light blocking layer 115, the first protective film 135, the data line 150, and the drain electrode 156 are formed using a single mask, thereby reducing the number of manufacturing steps and manufacturing cost. As a result of forming the light blocking layer 115, the first protective film 135, the data line 150, and the drain electrode 156 using a single mask, the outer sidewalls of the data line 150 and the drain electrode 156 (i.e., the sidewalls not covered by the oxide semiconductor layer 140) are arranged along substantially the same line as the underlying sidewalls of the first protective film 135 and the light blocking layer 115. Because the sidewalls of the light blocking layer 115 and the first protective film 135 are arranged along substantially the same line as the outer sidewalls of the data line 150 and the drain electrode 156, they are separated from the light blocking layer 115 and the first protective film 135 of a neighboring pixel.

Referring to FIGS. 2A and 2B, although the outer sidewalls of the data line 150 and the drain electrode 156 are shown as being disposed along the exact same line as the sidewalls of the first protective film 135 and the light blocking layer 115, this arrangement may be difficult to achieve in view of a manufacturing process of a TFT panel. For example, referring to FIG. 12, which is an enlarged detail view of the area in FIG. 2 encircled by the dashed line "E", the sidewall of the light blocking layer 115 is not disposed along the exact same line as the sidewall of the first protective film 135. Rather, the lower portion of the sidewall of the first protective film 135 protrudes by a distance "d2" from the upper portion of the sidewall of the light blocking layer 115. Also, the sidewalls of the first protective film 135 and the drain electrode 156 are not disposed along the exact same line. Rather, the upper portion of the sidewall of the first protective film 135 protrudes by a distance "d1" from the lower portion of the sidewall of the drain electrode 156. Similarly, even though not shown, the upper portion of the sidewall of the first protective film 135 protrudes from the lower portion of the sidewall of the data line 150.

The lower portion of the sidewall of the first protective film 135 protrudes from the upper portion of the sidewall of the light blocking layer 115, thereby resulting in an undercut in the light blocking layer 115. This undercut can result in failures, such as disconnects of the gate insulating layer 130. To solve this problem, an amount of the protrusion or the undercut can be controlled to be less than or equal to about 1 μm. Accordingly, "d1" and "d2" of FIG. 12 can be less than or equal to about 1 μm.

Figure 12:
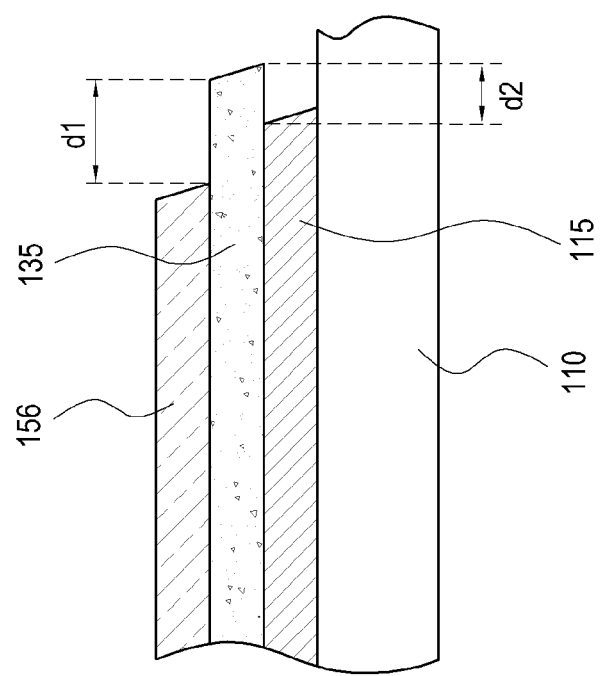
FIG. 12 is an enlarged detail view of the area in FIG. 2 that is encircled by the dashed line "E" according to an exemplary embodiment of the present invention.

FIG. 12 shows the sidewall of the first protective film 135 protruded from the sidewalls of the drain electrode 156 and the light blocking layer 115. However, other variations are possible. For example, the lower portion of the sidewall of the first protective film 135 can be disposed inside the upper portion of the sidewall of the light blocking layer 115 depending on the material of respective layers, an etchant, or an etching gas. In this case, the upper portion of the sidewall of the first protective film 135 protrudes from the lower portion of the outer sidewalls of the source electrode 152 and the drain electrode 156, and the upper portion of the sidewall of the light blocking layer 115 protrudes from the lower portion of the sidewall of the first protective film 135. Thus, the sidewalls of the source electrode 152, the drain electrode 156, the first protective film 135, and the light blocking layer 115 can have a step-shaped contour.

Figure 13A:
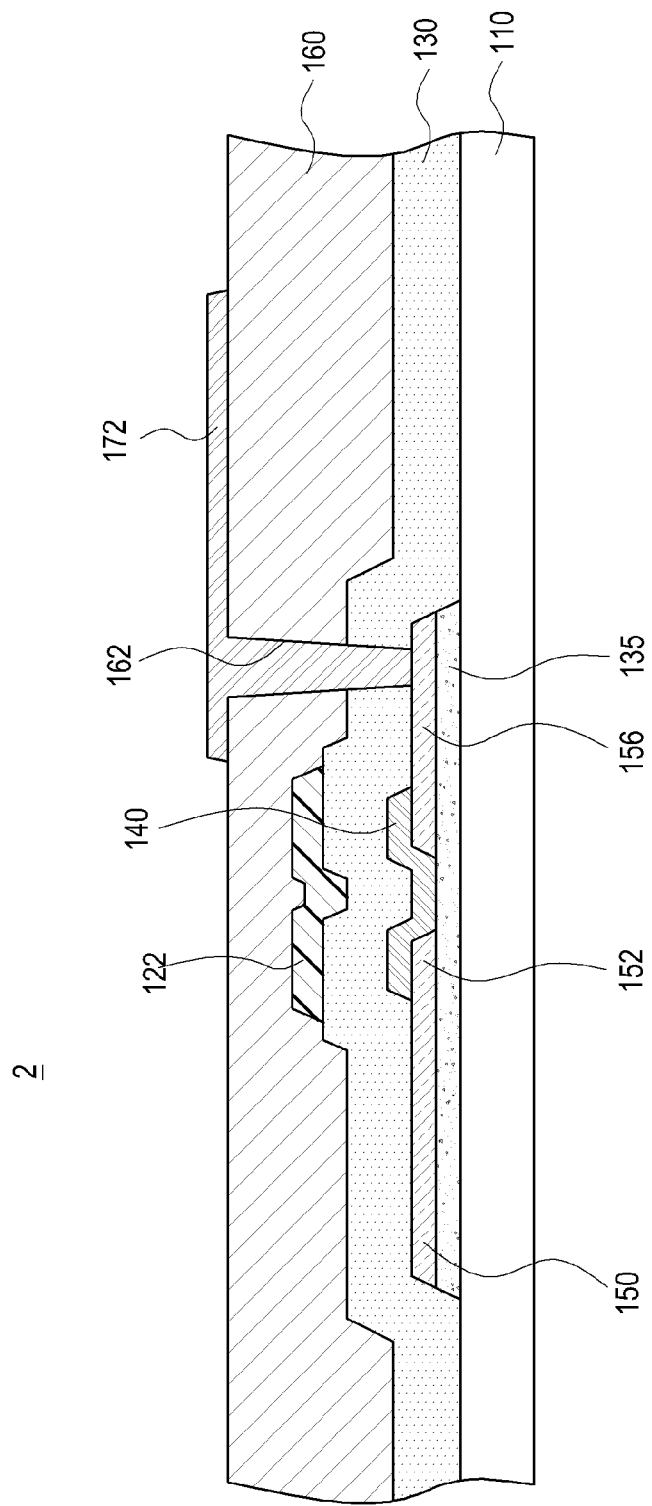
FIGS. 13A and 13B are cross-sectional views of a TFT panel according to another exemplary embodiment of the present invention.
Figure 13B:
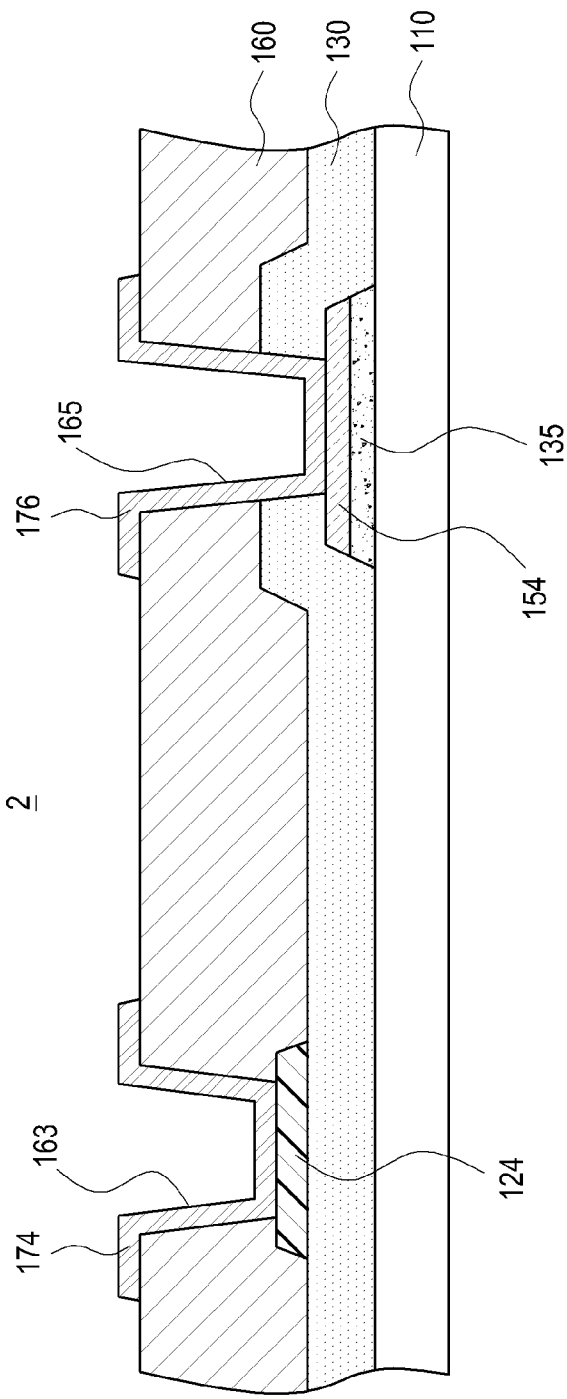

FIGS. 13A and 13B are cross-sectional views of a TFT panel 2 including opaque silicon oxide or opaque silicon nitride as a first protective film 135 without the light blocking layer 115 of FIGS. 2A and 2B. The opaque silicon oxide or the opaque silicon nitride is formed using a sputtering technique as noted in the description of FIGS. 4A and 4B.

The TFT panel 2 is substantially identical to the TFT panel 1 illustrated in FIGS. 1, 2A and 2B except for the omission of the light blocking layer 115. Thus, any further duplicated description will be omitted.

Figure 14A:
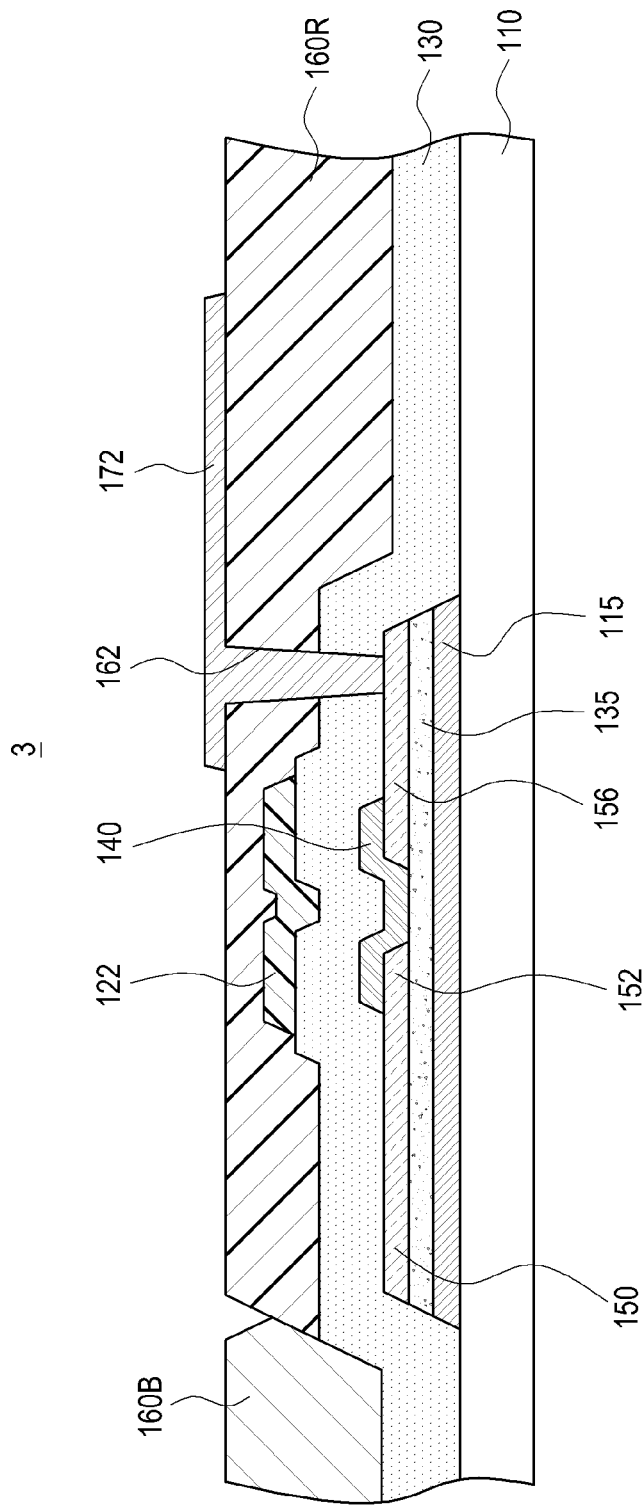
FIGS. 14A and 14B are cross-sectional views of a TFT panel according to another exemplary embodiment of the present invention.
Figure 14B:
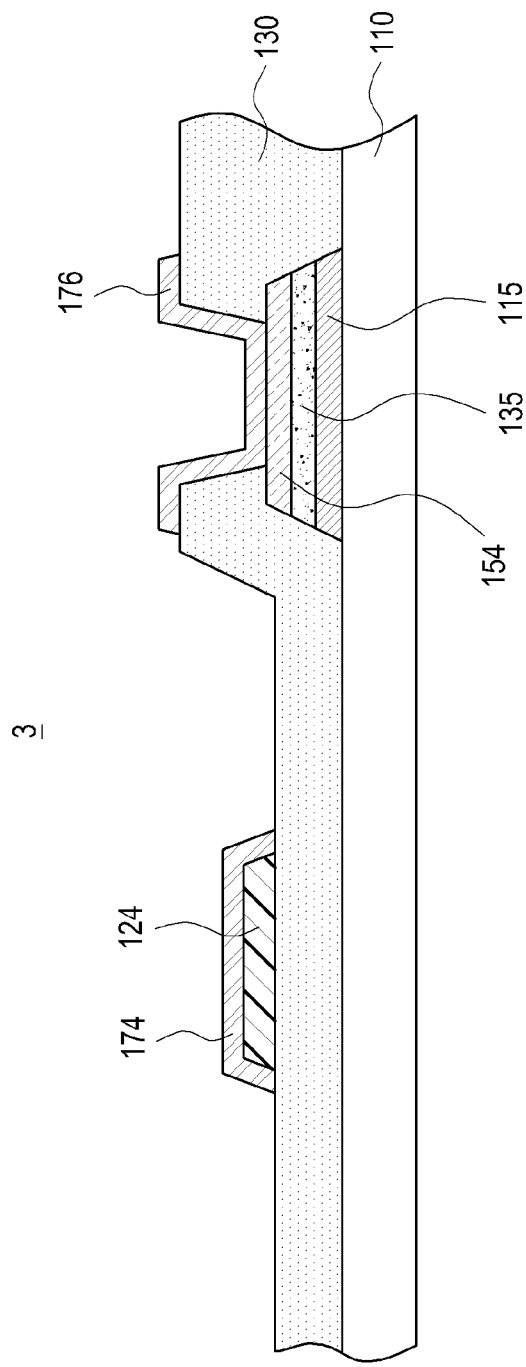

FIGS. 14A and 14B are cross-sectional views of a TFT panel 3 according to another exemplary embodiment of the present invention.

Referring to FIGS. 14A and 14B, the TFT panel 3 includes color filters 160R and 160B instead of the second protective film 160 of the TFT panel 1 of FIGS. 1, 2A and 2B.

As noted above, the gate insulating layer 130 protects the oxide semiconductor layer 140 from damage caused by subsequent processes. Accordingly, the oxide semiconductor layer 140 can be protected during the formation of the color filters 160R and 160B even though the second protective film 160 illustrated in FIGS. 1, 2A and 2B is omitted.

Referring to FIG. 14A, the color filters 160R and 160B are formed in the display area where thin film transistors and the pixel electrodes 172 are formed and images are displayed. On the other hand, referring to FIG. 14B, the color filters 160R and 160B are not formed in the non-display area where the gate pads 124 and the data pads 154 are formed. Thus, the first contact assistant 174 overlaps and contacts with sidewalls and the upper surface of the gate pad 124. The non-display area is a region for receiving external driving signals or generating driving signals and does not display images. Thus, color filters for displaying images can not be formed in the non-display area.

Figure 15:
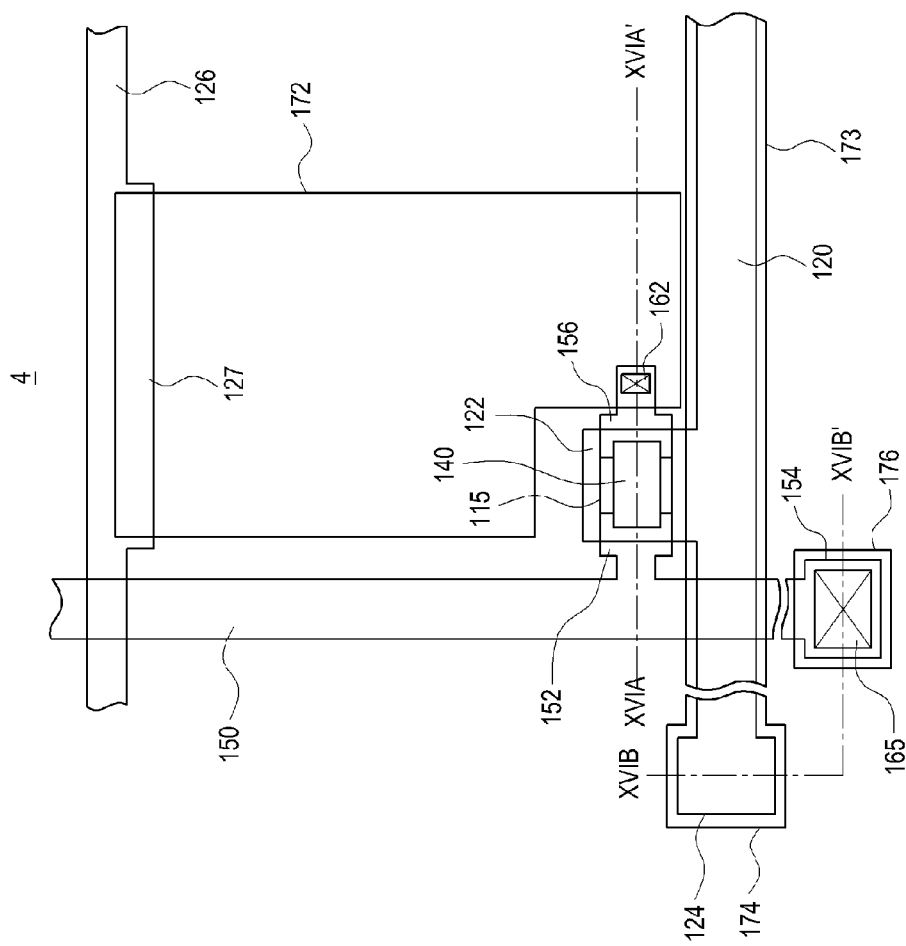
FIG. 15 is a plan view of a TFT panel according to another exemplary embodiment of the present invention.

FIG. 15 is a plan view of a TFT panel 4 according to another exemplary embodiment of the present invention. FIGS. 16A and 16B are cross-sectional views taken along the lines XVIA-XVIA' and XVIB-XVIB' of FIG. 15, respectively.

While the TFT panel 1 of FIGS. 1, 2A and 2B includes the second protective film 160 disposed on the gate line 120, gate electrode 122, gate pad 124, and gate insulating layer 130, the TFT panel 4 includes a transparent conductive film 173 and a first contact assistant 174 contacting with sidewalls and upper surface of the gate line 120 and gate pad 124 without the second protective film 160 of FIGS. 1, 2A and 2B. The TFT panel 4 is identical to the TFT panel 1 except for the above description Like numerals refer to like elements, and duplicate explanations are omitted.

Referring to FIGS. 16A and 16B, a drain contact hole 162 is formed through a gate insulating layer 130, and a drain electrode 156 is electrically connected to a pixel electrode 172 through the drain contact hole 162. A data pad contact hole 165 is formed through the gate insulating layer 130, and a second contact assistant 176 is formed on the gate insulating layer 130 and is electrically connected to the data pad 154 through the data pad contact hole 165. The data pad 154 is electrically connected to a data driving circuit (not shown) via the second contact assistant 176. The transparent conductive film 173, the pixel electrode 172, the first contact assistant 174, and the second contact assistant 176 are formed of a transparent conductive layer, as illustrated in the TFT panel 1. The transparent conductive film 173 covers the gate electrode 122, and the pixel electrode 172 is formed in the drain contact hole 162 and on the gate insulating layer 130. The first contact assistant 174 covers the gate pad 124, and the second contact assistant 176 contacts the exposed data pad 154 through the data pad contact hole 165. The gate insulating layer 130, which is formed on an oxide semiconductor layer 140, protects the oxide semiconductor layer 140 to reduce damage to the oxide semiconductor layer 140 caused from a subsequent process. Consequently, the omission of the second protective film 160 of FIGS. 1, 2A and 2B can reduce the number of manufacturing steps and the manufacturing cost.

Figure 17:
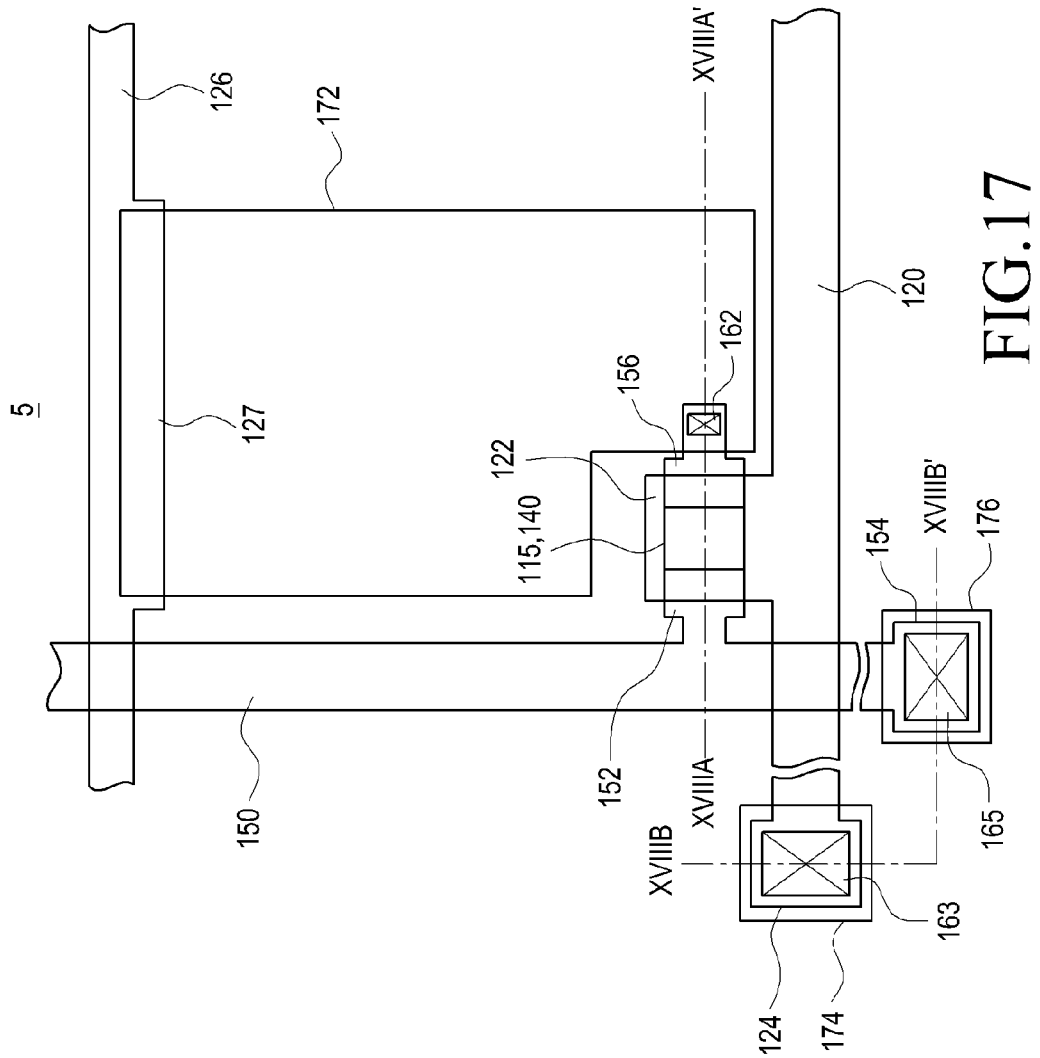
FIG. 17 is a plan view of a TFT panel according to another exemplary embodiment of the present invention.
Figure 18A:
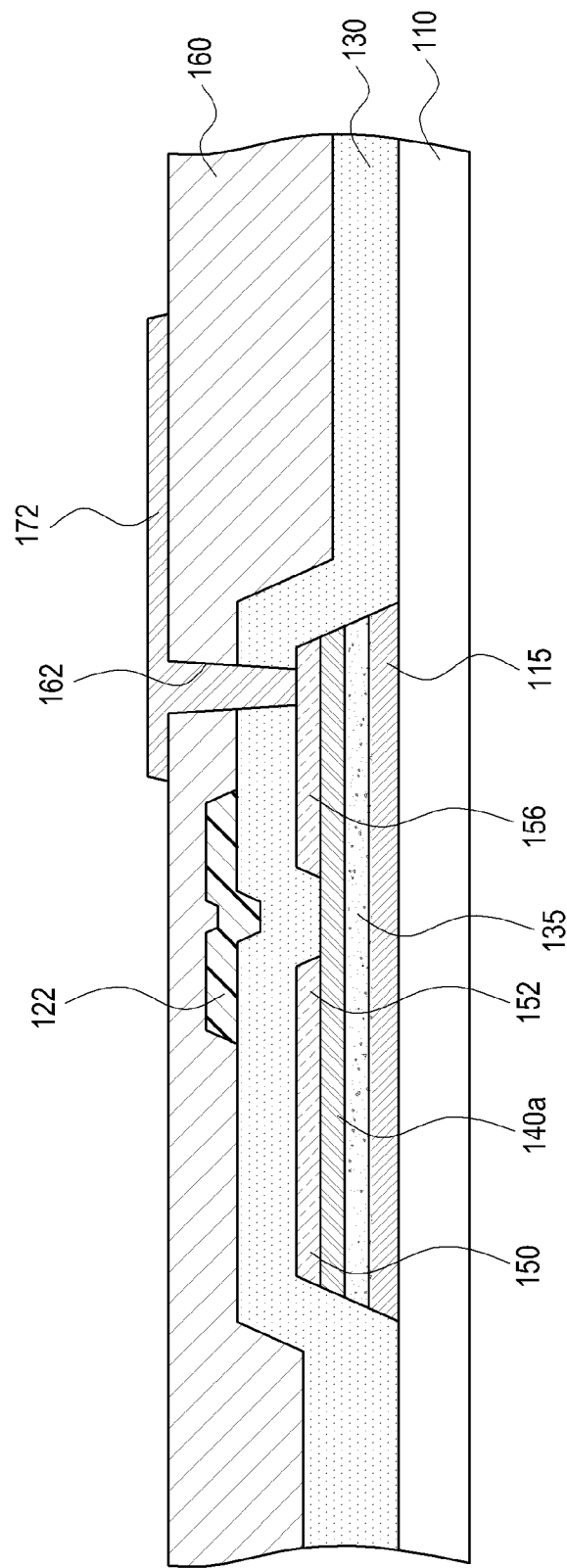
FIGS. 18A and 18B are cross-sectional views taken along the lines XVIIIA-XVIIIA' and XVIIIB-XVIIIB' of FIG. 17, respectively.
Figure 18B:
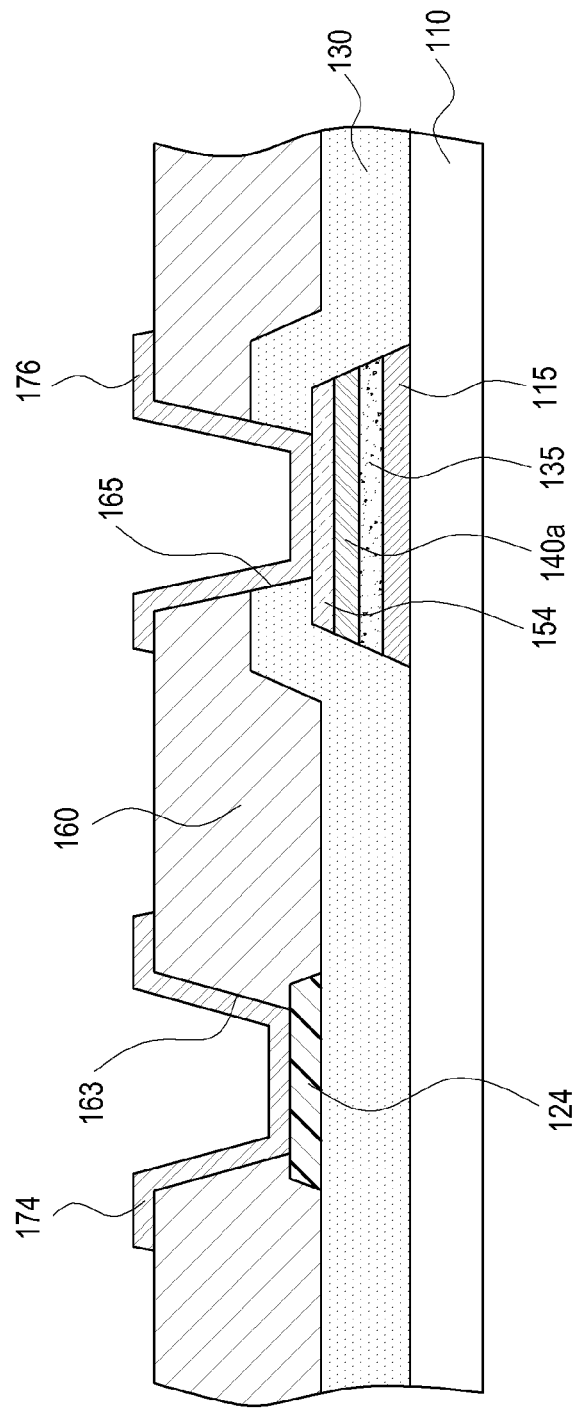

FIG. 17 is a plan view of a TFT panel 5 according to another exemplary embodiment of the present invention. FIGS. 18A and 18B are cross-sectional views taken along the lines XVIIIA-XVIIIA' and XVIIIB-XVIIIB' of FIG. 17, respectively.

The TFT panel 5 is substantially identical to the TFT panel 1 illustrated in FIGS. 1, 2A, and 2B except for the configuration of an oxide semiconductor layer 140a. Referring to FIGS. 2A and 2B, the oxide semiconductor layer 140 is formed on portions of a source electrode 152 and a drain electrode 156, as well as on a first protective film 135 exposed between the source electrode 152 and the drain electrode 156. Also, sidewalls of the oxide semiconductor layer 140 are disposed inside sidewalls of the first protective film 135 and the light blocking layer 115.

On the other hand, referring to FIGS. 18A and 18B, an oxide semiconductor layer 140a is formed between a first protective film 135 and a source electrode 152 and a drain electrode 156. The sidewalls of the oxide semiconductor layer 140a are aligned along substantially the same line with the sidewalls of a underlying light blocking layer 115 and the first protective film 135. Also, the outer sidewalls of a data line 150 and a drain electrode 156 are aligned along substantially the same line with the sidewalls of the oxide semiconductor layer 140a. That is, the sidewalls of the oxide semiconductor layer 140a are disposed along substantially the same line with the sidewalls of the light blocking layer 115, the first protective film 135, the data line 150 and the drain electrode 156. Also, the oxide semiconductor layer 140a is formed under a data pad 154, and the sidewalls of the data pad 154 are disposed along substantially the same line with the sidewalls of the oxide semiconductor layer 140a, the light blocking layer 115, and the first protective film 135.

FIGS. 19A to 22A and FIGS. 19B to 22B are showing steps for manufacturing a TFT panel 5 of FIG. 18A and FIG. 18B, respectively, according to an exemplary embodiment of the present invention.

Figure 19A:
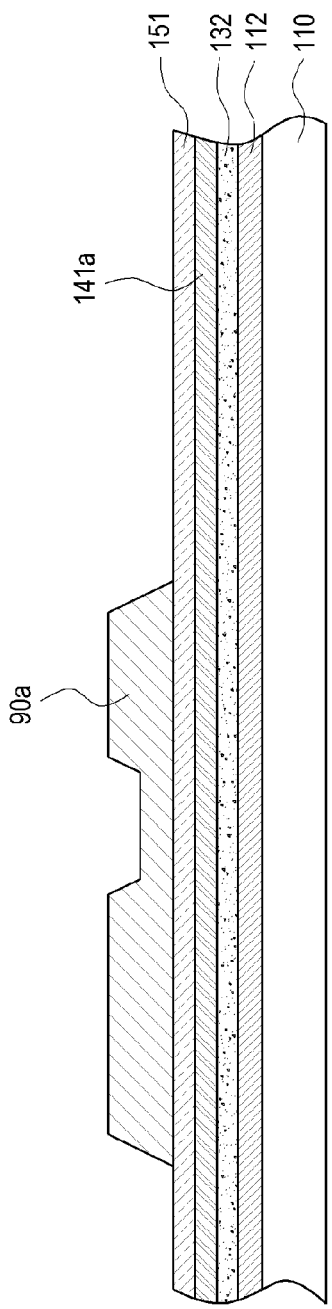
Figure 19B:
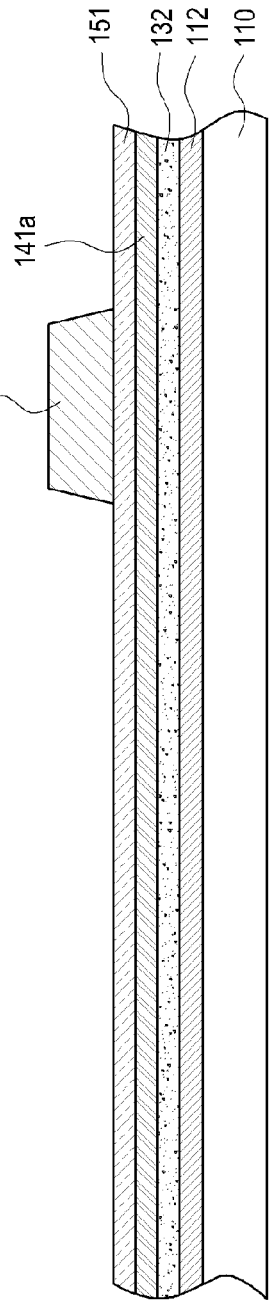

Referring to FIGS. 19A and 19B, a light blocking material 112, a protective layer 132, an oxide semiconductor material 141a, and a data conductive layer 151 are sequentially formed on an insulating substrate 110. The light blocking material 112 can include an opaque inorganic material or an opaque organic photo-sensitive resin. In one embodiment, the light blocking material 112 has a thickness of about 500 Å to 5000 Å. When the light blocking material 112 is formed of inorganic material such as chrome, a sputtering technique can be used. When the light blocking material 112 includes an organic photo-sensitive resin, a conventional slit coating technique can be used. The protective layer 132 can include silicon oxide (SiOx) and be formed using a chemical vapor deposition (CVD) or sputtering technique.

The oxide semiconductor material 141a can be formed by a sputtering technique. The oxide semiconductor material 141a may include one or more compounds represented by the formulas $A_xB_xO_x$ and $A_xB_xC_xO_x$. Here, A may be In, Zn, Ga, Hf, or Cd; B may be Zn, Ga, Sn, or In; C may be Sn, Zn, Cd, Ga, In, or Hf; and O is atomic oxygen. Each x is independently a non-zero integer, and A, B, and C are different from one another. For example, the oxide semiconductor material 141a can include one or more of the following compounds: InZnO, InGaO, InSnO, ZnSnO, GaSnO, GaZnO, GaZnSnO, GaInZnO, HfInZnO, HfZnSnO, and ZnO.

The data conductive layer 151 can be formed by a sputtering technique. The data conductive layer 151 can be formed of a single layer, double layer, or triple layer structure including at least one of Ni, Ti, Ag, Cu, Mo, Al, Nb, Au, Ta or combinations thereof.

For example, the double layered structure can be formed of Mo/Al, Ti/Al, Ta/Al, Ni/Al, TiNx/Al, Co/Al, CuMn/Cu, Ti/Cu, TiN/Cu, or TiOx/Cu. The triple layered structure can be formed of Mo/Al/Mo, Ti/Al/Ti, Co/Al/Co, Ti/Al/Ti, TiNx/Al/Ti, CuMn/Cu/CuMn, Ti/Cu/Ti, TiNx/Cu/TiNx, or TiOx/Cu/TiOx. The thickness of the data conductive layer 151 can vary depending on material thereof. For example, when the data conductive layer 151 is the double layered structure of Cu/Ti, Cu can have a thickness in the range of 2000 Å to 10000Å and Ti can have a thickness in the range of 100Å to 1000 Å.

A photo-resist (not shown) is coated on the data conductive layer 151 and patterned using a photolithography process using a half-tone or slit mask to form a first photo-resist pattern 90a with a step portion and a first photo-resist pattern 90b without a step portion. The first photo-resist pattern 90a with a step portion is formed in the region corresponding to a channel region between a source electrode 152 and a drain electrode 156, a data line 150 having the source electrode 152, and the drain electrode 156 of FIG. 17. The first photo-resist pattern 90b without a step portion is formed in the region corresponding to a data pad 154. The portion of the first photo-resist pattern 90a in the area corresponding to the channel is thinner than other portions of the first photo-resist pattern 90a.

Referring to FIGS. 20A and 20B, the data conductive layer 151, the oxide semiconductor material 141a, the protective layer 132, and the light blocking material 112 are sequentially patterned using the first photo-sensitive pattern 90a and 90b as an etching mask to is form a data conductive pattern 155, an oxide semiconductor layer 140a, a first protective film 135, a light blocking layer 115, and a data pad 154. The first protective film 135 and the light blocking layer 115 have sidewalls.

The patterning method of the data conductive layer 151 can be adjusted depending on the material thereof. In one embodiment, when the data conductive layer 151 is formed of Mo/Al/Mo, it can be etched using a wet etching process using an etchant of phosphoric acid, nitric acid, and acetic acid. For example, a ratio of mixed solution of phosphoric acid, nitric acid, and acetic acid can be 73.4:5.4:4.0. In another embodiment, when the data conductive layer 151 is formed of Cu/Ti, it can be etched using a wet etching process using an etchant of ammonium persulfate, nitric acid, aminotetrazole, and methanesulfonic acid. For example, a ratio of mixed solution of ammonium persulfate, nitric acid, aminotetrazole, and methanesulfonic acid can be 12:2:1:0.1.

The oxide semiconductor material 141a can be patterned using a wet etching process using a mixed solution of nitric acid, sulfuric acid, and ethylene glycol. For example, a ratio of the mixed solution can be 5:0.1:10 to 15:1:20.

The protective layer 132 formed of silicon oxide or silicon nitride can be patterned using a drying etching process using a mixture gas including $SF_6$ or $C_4F_8$ and $O_2$. For example, while a ratio of $SF_6$ and $O_2$ may be 4:1, a ratio of $C_4F_8$ and $O_2$ may be 3:1.

The light blocking material 112 formed of chrome can be etched using a wet etching process using an etchant including ceric ammonium nitrate and nitric acid. For example, a ratio of ceric ammonium nitrate and nitric acid may be 10:5 or 14:10.

Referring to FIGS. 21A and 21B, the step portion of the first photo-resist pattern 90a and a portion of the first photo-resist pattern 90b are removed using an ashing process to form a second photo-resist pattern 99a and 99b. By the ashing process, the step portion of the first photo-resist pattern 90a and a portion of the first photo-resist pattern 90b are removed and the remaining portions of the first photo-resist pattern 90a and 90b become the second photo-resist pattern 99a and 99b, which is thinner than the first photo-resist pattern 90a and 90b.

Referring to FIGS. 22A and 22B, an exposed portion of the data conductive pattern 155 is removed using the second photo-resist pattern 99a and 99b as an etching mask to form a data line 150, which includes a source electrode 152 and a data pad 154, and a drain electrode 156. In this case, an etching process to minimize damage of the channel area in the oxide semiconductor layer 140a can be used. In one embodiment, when the data conductive layer 151 is formed of Mo/Al/Mo, it can be etched using a dry etching process using a mixture gas including $SF_6$, $Cl_2$, $BCl_3$, or $O_2$. In detail, a ratio of $SF_6$:$Cl_2$ can be 1:5 for etching the upper Mo of Mo/Al/Mo. For Al, a ratio of $Cl_2$:$BCl_3$ can be 2:3. For Mo, a ratio of $Cl_2$:$O_2$ can be 1:4. In another embodiment, when the data conductive layer 151 is formed of Ti/Cu, Cu can be etched using a wet etching process using an etchant including ammonium persulfate, nitric acid, and inorganic acid, and Ti can be etched by dry etching process using a gas mixture of $Cl_2$ and $BCl_3$. For example, a mixture ratio of the etchant can be 12:2:1 of ammonium persulfate, nitric acid and inorganic acid, and a mixture ratio of the gas can be 1:2 of $Cl_2$ and $BCl_3$.

Referring to FIGS. 18A and 18B, a gate insulating layer 130 is formed on the data line 150 having the source electrode 152 and the data pad 154, the drain electrode 156, sidewalls thereof, and the insulating substrate 110. A gate line 120 having a gate electrode 122 and a gate pad 124 is formed on the gate insulating layer 130. A second protective film 160, which may be formed of a single layer, is formed on the gate line 120. A gate pad contact hole 163 is formed in the second protective film 160, and a drain contact hole 162 and a data pad contact hole 165 are formed in the second protective film 160 and the gate insulating layer 130. A transparent conductive layer is formed in the contact holes 162, 163, and 165 and on the second protective film 160. The transparent conductive layer is patterned to form a pixel electrode 172, a first contact assistant 174, and a second contact assistant 176. The pixel electrode 172 is electrically connected to the drain electrode 156 through the drain contact hole 162. The first contact assistant 174 is electrically connected to the gate pad 124 through the gate pad contact hole 163, and the second contact assistant 176 is electrically connected to the data pad 154 through the data pad contact hole 165.

While the second protective film 160 formed of a single layer is illustrated in this exemplary embodiment, the second protective film 160 can be omitted. The second protective film 160 formed of a single layer includes at least one of silicon oxide (SiOx), silicon nitride (SiNx), an organic film such as acrylate, or a color filter layer.

The formation of the gate insulating layer 130, the gate line 120, the second protective film 160, the gate pad contact hole 163, the drain contact hole 162, the data pad contact hole 165, the pixel electrode 172, the first contact assistant 174 and the second contact assistant 176 is identical to the manufacturing process of the TFT panel 1 illustrated in FIGS. 1, 2A and 2B. Thus, duplicated explanation will be omitted.

According to this exemplary embodiment, the gate insulating layer 130 is formed on and protects the oxide semiconductor layer 140a, thereby permitting omission of the second protective film 160 or formation of the second protective film 160 as a single layer to reduce the number of manufacturing process and cost. Furthermore, the exemplary embodiments shown in FIGS. 14A, 14B, 15, 16A, and 16B may also be applied to the TFT panel 5 of FIGS. 17, 18A, and 18B.

Also, the light blocking layer, the first protective film, the oxide semiconductor layer, the data line, and the drain electrode are formed using a single mask, thereby reducing the number of photolithography process. Furthermore, because the light blocking layer, the first protective film, the oxide semiconductor layer, the data line and the drain electrode are formed using a single mask, at least portions of sidewalls of the light blocking layer, the first protective film, the oxide semiconductor layer, the data line, and the drain electrode are disposed along substantially the same line.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming a panel comprising a thin film transistor, the method comprising:
    forming a light blocking layer on a substrate;
    forming a first protective film on the light blocking layer;
    forming a first electrode and a second electrode on the first protective film and spaced apart from each other;
    forming an oxide semiconductor layer on a portion of the first protective film exposed between the first electrode and the second electrode and on at least a portion of the first electrode and the second electrode;
    forming an insulating layer on the oxide semiconductor layer, the first electrode, and the second electrode;
    forming a third electrode overlapping the oxide semiconductor layer and on the insulating layer; and
    forming a fourth electrode on the insulating layer and connected to the second electrode,
    wherein the light blocking layer, the first protective film, the first electrode, and the second electrode are formed using a single mask.

2. The method of claim 1, wherein forming the light blocking layer, the first protective film, the first electrode, and the second electrode using the single mask comprises:
    forming a light blocking material on the substrate;
    forming a protective layer on the light blocking material;
    forming a first conductive layer on the protective layer;
    forming a photo-resist on the protective layer and pattering the photo-resist using the single mask to form a photo-resist pattern with a step portion, and
    etching the light blocking material, the protective layer, and the first conductive layer using the photo-resist pattern as an etching mask to form the light blocking layer, the first protective film, the first electrode, and the second electrode.

3. The method of claim 2, wherein a portion of the photo-resist pattern in an area corresponding to an area between the first electrode and the second electrode is thinner than a portion of the photo-resist pattern in an area corresponding to the first electrode and the second electrode.

4. The method of claim 3, wherein forming the first electrode and the second electrode comprises etching the first conductive layer to form a data line connected to the first electrode and a data pad connected to the end of the data line.

5. The method of claim 4, wherein forming the third electrode comprises:
   forming a second conductive layer on the insulating layer;
   patterning the second conductive layer to form the third electrode, a gate line, and a gate pad, the gate line connected to the third electrode, and the gate pad connected to the end of the gate line.

6. The method of claim 3, wherein forming the fourth electrode comprises:
   forming a transparent conductive layer on the third electrode and the insulating layer; and
   patterning the transparent conductive layer to form the fourth electrode and a transparent conductive film, the transparent conductive film being in contact with the third electrode.

7. A method for forming a panel comprising a thin film transistor, the method comprising:
   forming a light blocking layer on a substrate;
   forming a first protective film on the light blocking layer;
   forming an oxide semiconductor layer on the first protective film;
   forming a first electrode and a second electrode spaced apart from each other on the oxide semiconductor layer;
   forming an insulating layer on the oxide semiconductor layer, the first electrode, and the second electrode;
   forming a third electrode overlapping the oxide semiconductor layer and on the insulating layer; and
   forming a fourth electrode on the insulating layer, the fourth electrode being connected to the second electrode,
   wherein the light blocking layer, the first protective film, the oxide semiconductor layer, the first electrode, and the second electrode are formed using a single mask.

8. A method for forming a panel comprising a thin film transistor, the method comprising:
   forming a first protective film on a substrate;
   forming a first electrode and a second electrode on the first protective film, the first electrode and the second electrode being spaced apart from each other and exposing a portion of the first protective film;
   forming an oxide semiconductor layer on the first electrode, the second electrode, and the exposed portion of the first protective film;
   forming an insulating layer on the oxide semiconductor layer, the first electrode, and the second electrode;
   forming a third electrode on the insulating layer; and
   forming a fourth electrode on the insulating layer, the fourth electrode connected to the second electrode,
   wherein the first protective film is formed to be opaque by controlling a partial pressure of nitrogen gas or oxygen gas.

* * * * *